US012597473B2

(12) United States Patent
Chen et al.

(10) Patent No.: US 12,597,473 B2
(45) Date of Patent: Apr. 7, 2026

(54) MULTI-STEP READ PASS VOLTAGE DISCHARGE FOR ICC REDUCTION

(71) Applicant: Sandisk Technologies, Inc., Milpitas, CA (US)

(72) Inventors: Albert Bor Kai Chen, Milpitas, CA (US); Xiang Yang, Santa Clara, CA (US); Jiahui Yuan, Fremont, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 207 days.

(21) Appl. No.: 18/360,084

(22) Filed: Jul. 27, 2023

(65) Prior Publication Data

US 2024/0379170 A1     Nov. 14, 2024

Related U.S. Application Data

(60) Provisional application No. 63/500,732, filed on May 8, 2023.

(51) Int. Cl.
*G11C 16/26*      (2006.01)
*G11C 16/04*      (2006.01)
*G11C 16/08*      (2006.01)

(52) U.S. Cl.
CPC .......... *G11C 16/26* (2013.01); *G11C 16/0433* (2013.01); *G11C 16/08* (2013.01)

(58) Field of Classification Search
CPC ...... G11C 16/26; G11C 16/0433; G11C 16/08
USPC ................................................. 365/189.011
See application file for complete search history.

(56) References Cited

U.S. PATENT DOCUMENTS

| | | | |
|---|---|---|---|
| 9,336,892 B1 | 5/2016 | Chen et al. | |
| 9,620,233 B1 | 4/2017 | Dong et al. | |
| 9,905,305 B2 | 2/2018 | Chen et al. | |
| 10,217,518 B1 | 2/2019 | Chen et al. | |
| 10,276,248 B1 | 4/2019 | Lu et al. | |
| 10,629,272 B1 | 4/2020 | Lu et al. | |
| 10,726,891 B1 | 7/2020 | Prakash et al. | |
| 11,043,266 B1* | 6/2021 | Tagar ...................... | G11C 7/04 |
| 11,139,090 B1 | 10/2021 | Prakash et al. | |
| 11,335,413 B2 | 5/2022 | Lien et al. | |
| 11,404,123 B1* | 8/2022 | Shao ...................... | H10B 41/41 |
| 11,551,761 B1* | 1/2023 | Yang ...................... | G11C 16/10 |
| 11,972,812 B2* | 4/2024 | Song .................. | G11C 16/3404 |
| 2021/0174873 A1* | 6/2021 | Kim ...................... | G11C 16/30 |

(Continued)

*Primary Examiner* — Alexander Sofocleous
*Assistant Examiner* — Duy H Luong
(74) *Attorney, Agent, or Firm* — Pearl Cohen Zedek Latzer Baratz LLP

(57) ABSTRACT

Technology is disclosed herein for a storage system and method for multi-stage discharge of a read pass voltage. In an aspect, the voltage on unselected word lines is reduced from the read pass voltage to an intermediate voltage during a first stage near the end of a read operation. A read reference voltage on the selected word line may be changed (e.g., increased) to the intermediate voltage during the first stage. During a second stage the voltage on the unselected word lines may be reduced from the intermediate voltage to a final voltage. The voltage on the selected word line may also be decreased during the second stage from the intermediate voltage to the final voltage. The multi-stage discharge of the read pass voltage may reduce peak current consumption (e.g., peak Icc) in a final portion of the read operation.

19 Claims, 18 Drawing Sheets

(56) References Cited

U.S. PATENT DOCUMENTS

| | | | |
|---|---|---|---|
| 2022/0310163 A1* | 9/2022 | Lee ........................ | G11C 16/26 |
| 2022/0392530 A1* | 12/2022 | Yang .................. | G11C 16/0483 |

\* cited by examiner

900

MULTI-STEP READ PASS VOLTAGE DISCHARGE FOR ICC REDUCTION

CLAIM OF PRIORITY

The present application claims priority from U.S. Provisional Patent Application No. 63/500,732, entitled "MULTI-STEP READ PASS VOLTAGE DISCHARGE FOR ICC REDUCTION," by Chen et al., filed May 8, 2023, incorporated by reference herein in its entirety.

BACKGROUND

The present disclosure relates to non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery).

A memory structure in the memory system typically contains many memory cells and various control lines. Herein, a memory system that uses non-volatile memory for storage may be referred to as a storage system. The memory structure may be three-dimensional (3D). One type of 3D structure has non-volatile memory cells arranged as vertical NAND strings. The 3D memory structure may be arranged into units that are commonly referred to as blocks. For example, a block in a NAND memory system contains many NAND strings. A NAND string contains memory cell transistors connected in series, a drain side select gate at one end, and a source side select gate at the other end. The memory cell transistor has a control gate. Each NAND string is associated with a bit line. The block typically has many word lines that provide voltages to the control gates of the memory cell transistors. In some architectures, each word line connects to the control gate of one memory cell on each respective NAND string in the block.

The memory cells are programmed one group at a time. Typically, the memory cells are programmed to a number of data states. Using a greater number of data states allows for more bits to be stored per memory cell. For example, four data states may be used to store two bits per memory cell, eight data states may be used in order to store three bits per memory cell, 16 data states may be used to store four bits per memory cell, etc. Some memory cells may be programmed to a data state by storing charge in the memory cell. For example, the threshold voltage (Vt) of a NAND memory cell can be set to a target Vt by programming charge into a charge storage region such as a charge trapping layer. The amount of charge stored in the charge trapping layer establishes the Vt of the memory cell. Programming may include applying a program voltage to the control gate of the memory cell, followed by a verify operation that tests the Vt of the memory cell. Programming may continue in this manner until a target Vt is reached.

A selected memory cell on a NAND may be read by applying a read reference voltage to the control gate of the selected memory cell while applying a read pass voltage to the control gates of other memory cells ("unselected memory cells") on the NAND string. The read reference voltage will test whether the Vt of the memory cell is above/below the read reference voltage. The read pass voltage has a sufficiently high magnitude to be above the highest Vt of any of the unselected memory cells. Thus, the unselected memory cells should each turn on. The selected memory cell might or might not turn on and conduct a significant current, depending on its Vt. The bit line current may be sensed to determine the state of the selected memory cell. The amount of current drawn by the storage system during the read process will vary over time throughout the read. There could be large peaks in the current drawn by the storage system during certain parts of the read.

There are often limits to the peak current that can be provided from a host system to the storage system. The term "peak Icc" is used to refer to the peak amount of current that is drawn by the storage system. The term "Icc" is typically used to refer to a current provided to the storage system by a power source. The term "specified peak Icc" refers to a maximum allowed peak Icc. For example, there may be a specification that defines the specified peak Icc. If the peak current drawn by the storage system is greater than the specified peak Icc, then the magnitude of the supply voltage may drop, which can result in operation failure in the storage system. Much of the power and/or current that is used by the storage system is used to perform memory operations such as reading the memory cells on memory dies. Hence, the regulation of the power and/or current used by the memory dies is important in order to keep the peak Icc of the storage system within the specified peak Icc.

BRIEF DESCRIPTION OF THE DRAWINGS

Like-numbered elements refer to common components in the different figures.

DETAILED DESCRIPTION

Technology is disclosed herein for a storage system and method for multi-stage discharge of a read pass voltage. The multi-stage discharge of the read pass voltage (e.g., Vread) may reduce peak current consumption (e.g., peak Icc). In an embodiment, the voltage on the unselected word lines is reduced from Vread to an intermediate voltage during a first stage near the end of a read operation. The read reference voltage on the selected word line may be changed (e.g., increased) to the intermediate voltage during the first stage. During a second stage the voltage on the unselected word lines may be reduced from the intermediate voltage to a final voltage. The voltage on the selected word line may also be decreased during the second stage from the intermediate voltage to the final voltage.

Furthermore note that if may be beneficial to have a greater number of word lines in a block to meet goals such as bit density and/or cost per bit. However, additional word lines can increase the RC loading. Moreover, it may be beneficial to have a larger word line size (e.g., area) to provide for more memory cells in a block. However, the larger word line size can also increase RC loading. This RC loading may impact peak Icc consumption during read. Therefore, meeting peak Icc specifications during read may become more challenging in future generations of memory systems. Embodiments of a system and method for multi-stage discharge of a read pass voltage are capable of meeting peak Icc specifications, while allowing for a high number and/or size of word lines.

Moreover, embodiments of a system and method for multi-stage discharge of a read pass voltage are capable of a low peak Icc while completing the read quickly. An embodiment of multi-stage discharge of a read pass voltage has a relatively uniform current profile, which not only keeps the peak Icc low, but also does not need to increase the time for the read operation to keep peak Icc low.

Figure 1:
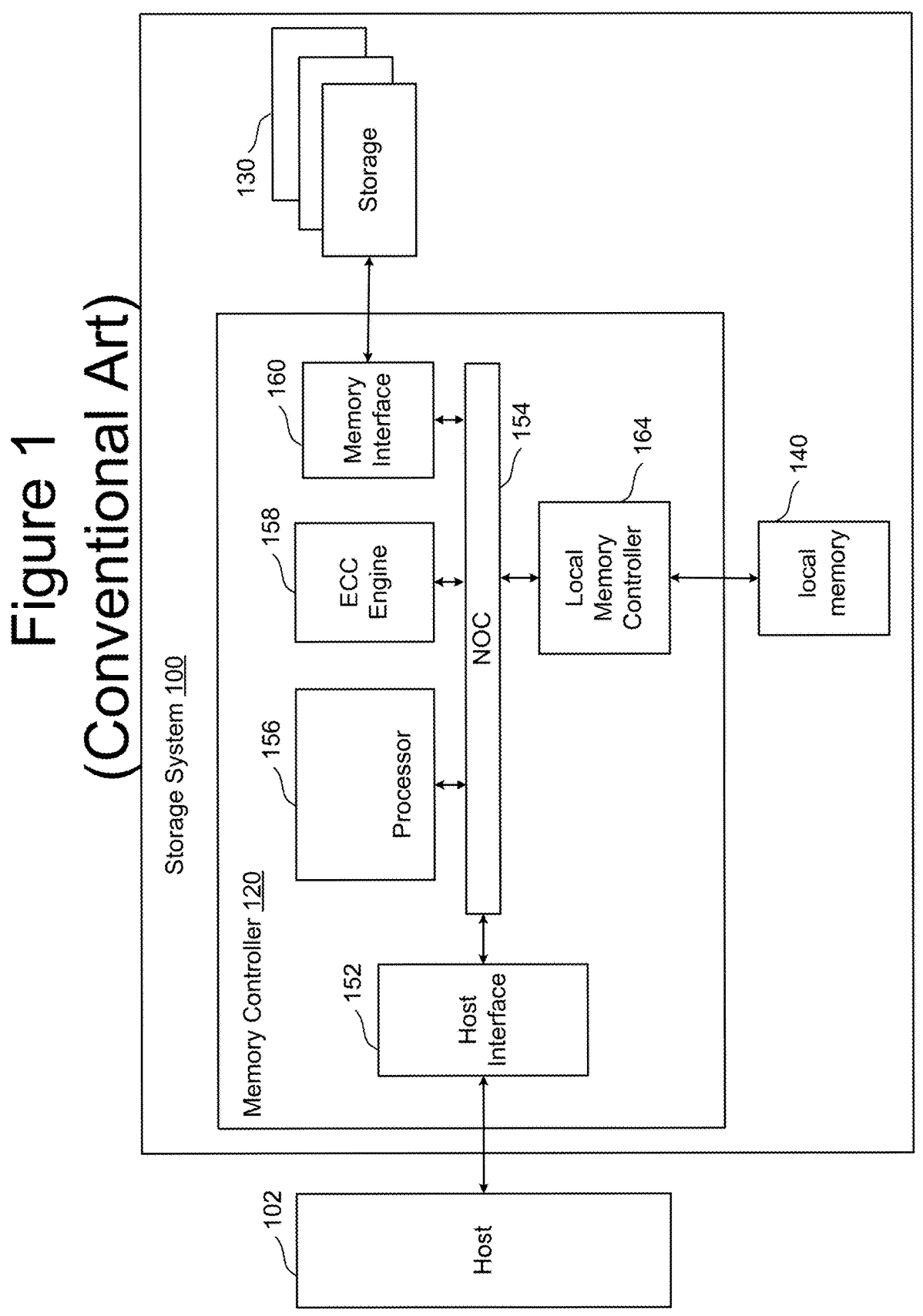
FIG. 1 is a block diagram depicting one embodiment of a storage system.

FIG. 1 is a block diagram of one embodiment of a storage system 100 that implements the technology described herein. In one embodiment, storage system 100 is a solid state drive ("SSD"). Storage system 100 can also be a memory card, USB drive or other type of storage system. The proposed technology is not limited to any one type of storage system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 (or storage controller) connected to non-volatile storage 130 and local high speed memory 140

(e.g., DRAM, SRAM, MRAM). Local memory 140 is non-transitory memory, which may include volatile memory or non-volatile memory. Local high speed memory 140 is used by memory controller 120 to perform certain operations. For example, local high speed memory 140 may store logical to physical address translation tables ("L2P tables").

Memory controller 120 comprises a host interface 152 that is connected to and in communication with host 102. In one embodiment, host interface 152 implements an NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and local memory controller 164. Local memory controller 164 is used to operate and communicate with local high speed memory 140 (e.g., DRAM, SRAM, MRAM).

ECC engine 158 performs error correction services. For example, ECC engine 158 performs data encoding and decoding. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory die. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a storage 130 and a subset of the L2P tables are cached (L2P cache) in the local high speed memory 140.

Memory interface 160 communicates with non-volatile storage 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
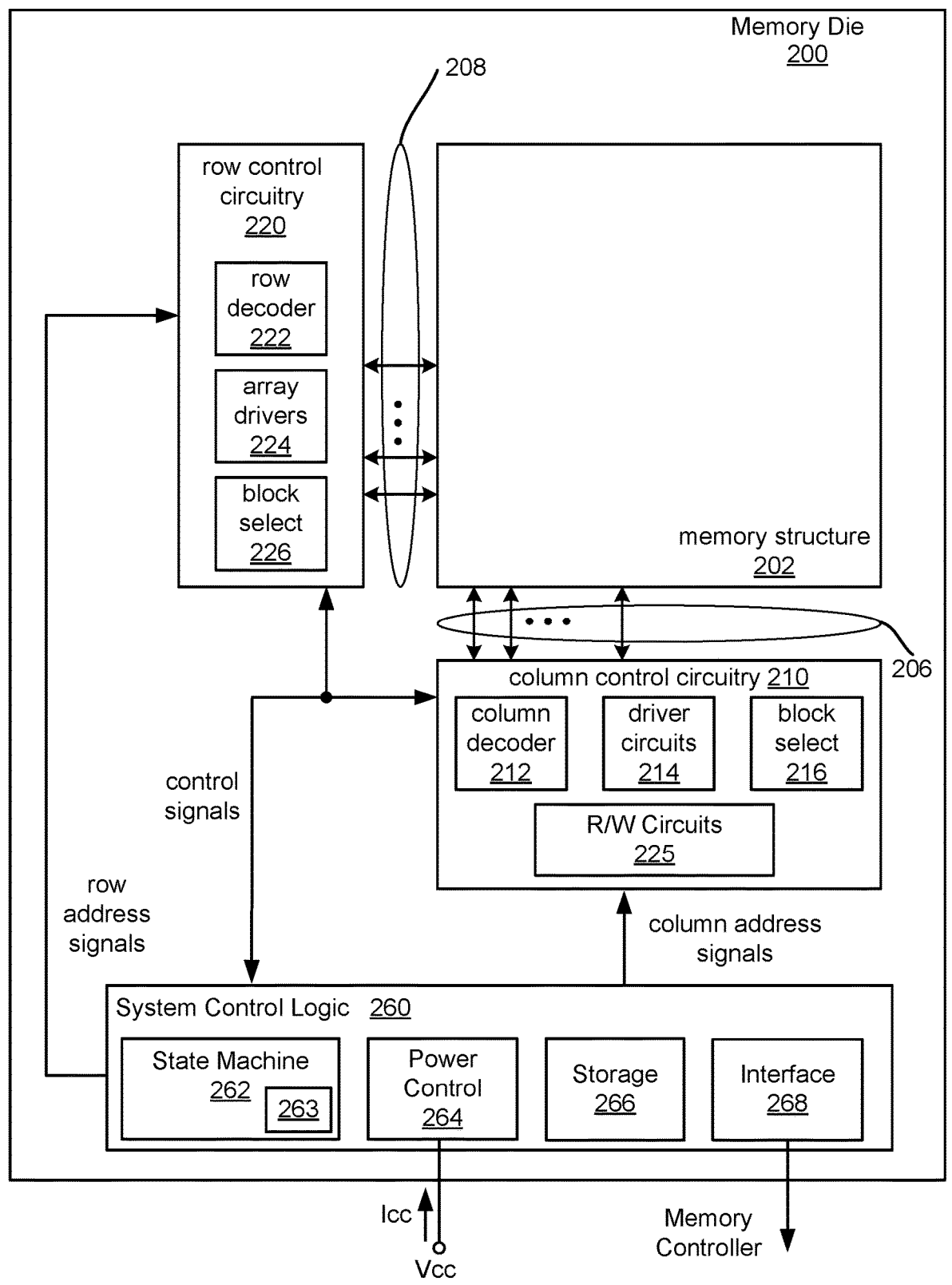
FIG. 2A is a block diagram of one embodiment of a memory die.

In one embodiment, non-volatile storage 130 comprises one or more memory dies. FIG. 2A is a functional block diagram of one embodiment of a memory die 200 that comprises non-volatile storage 130. Each of the one or more memory dies of non-volatile storage 130 can be implemented as memory die 200 of FIG. 2A. The components depicted in FIG. 2A are electrical circuits. Memory die 200 includes a memory structure 202 (e.g., memory array) that can comprise non-volatile memory cells (also referred to as non-volatile storage cells), as described in more detail below. The array terminal lines of memory structure 202 include the various layer(s) of word lines organized as rows, and the various layer(s) of bit lines organized as columns. However, other orientations can also be implemented. Memory die 200 includes row control circuitry 220, whose outputs are connected to respective word lines of the memory structure 202. Row control circuitry 220 receives a group of M row address signals and one or more various control signals from System Control Logic circuit 260, and typically may include such circuits as row decoders 222, array drivers 224, and block select circuitry 226 for both reading and writing (programming) operations. Row control circuitry 220 may also include read/write circuitry. Memory die 200 also includes column control circuitry 210 including read/write circuits 225. The read/write circuits 225 may contain sense amplifiers and data latches. The sense amplifier(s) input/outputs are connected to respective bit lines of the memory structure 202. Although only single block is shown for structure 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers. The system control logic 260, column control circuitry 210, and/or row control circuitry 220 are configured to control memory operations such as open block reads at the die level.

System control logic 260 receives data and commands from memory controller 120 and provides output data and status to the host. In some embodiments, the system control logic 260 (which comprises one or more electrical circuits) includes state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory structure 202 during memory operations. The power control module 264 may be connected to a terminal to receive a power supply voltage (e.g., Vcc). Vcc is one example name for a power supply voltage, but a different name could be used. The memory die 200 may draw a current (e.g., Icc) as result of performing memory operations. In an embodiment, the power control module 264 generates an internal supply voltage referred to as Vdd. System control logic 260 includes storage 266 (e.g., RAM, registers, latches, etc.), which may be used to store parameters for operating the memory structure 202.

In an embodiment, the state machine 262 communicates with power control 264 to control voltages applied to the memory structure during read operations. The power control 264 may generate the voltages. Those voltages may include one or more read reference voltages (e.g., Vcgr) applied to a selected word line, a read pass voltage (e.g., Vread) applied to unselected word lines, and select voltages applied to select lines. The state machine 262 may communicate with the power control 264 to control the magnitude and/or timing of such voltages. In an embodiment, the state machine 262 has multi-step Vread discharge logic 263, which controls the discharge of Vread at the conclusion of a read operation. The multi-step Vread discharge may reduce peak Icc during a final portion of the read operation.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used. The commands may include one or more commands to execute an open block read in accordance with one or more embodiments described herein.

In some embodiments, all the elements of memory die 200, including the system control logic 260, can be formed as part of a single die. In other embodiments, some or all of the system control logic 260 can be formed on a different die than the die that contains the memory structure 202.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies. Three-dimensional NAND structures (see, for example, FIG. 4) in particular may benefit from specialized processing operations.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more dies, such as two memory dies and one control die, for example.

Figure 2B:
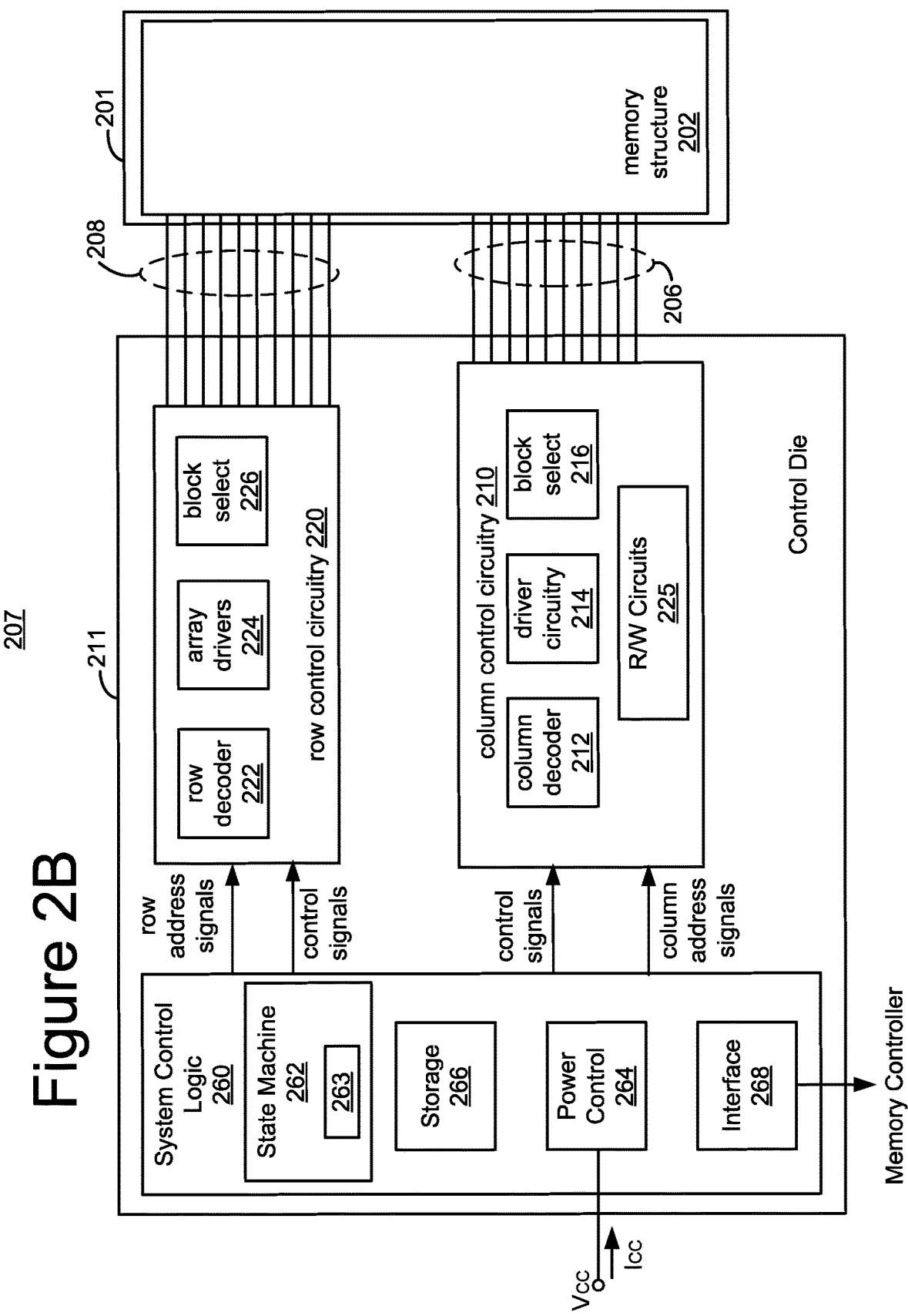
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile storage 130 of storage system 100. The integrated memory assembly 207 includes two types of semiconductor dies (or more succinctly, "die"). Memory structure die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory structure die 201. In some embodiments, the memory structure die 201 and the control die 211 are bonded together.

FIG. 2B shows an example of the peripheral circuitry, including control circuits, formed in a peripheral circuit or control die 211 coupled to memory structure 202 formed in memory structure die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory structure die 201. In some embodiments, some of the circuitry in the system control logic 260 is located on the on the memory structure die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory structure die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including read/write circuits 225 on the control die 211 coupled to memory structure 202 on the memory structure die 201 through electrical paths 206. For example, electrical paths 206 may provide electrical connection between column decoder 212, driver circuitry 214, and block select 216 and bit lines of memory structure 202. Electrical paths may extend from column control circuitry 210 in control die 211 through pads on control die 211 that are bonded to corresponding pads of the memory structure die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select 226 are coupled to memory structure 202 through electrical paths 208. Each electrical path 208 may correspond to a word line, dummy word line, or select gate line. Additional electrical paths may also be provided between control die 211 and memory structure die 201.

For purposes of this document, the phrases "a control circuit" or "one or more control circuits" can include any one of or any combination of all or a portion of system control logic 260, all or a portion of row control circuitry 220, all or a portion of column control circuitry 210, read/write circuits 225, sense amps, a microcontroller, a microprocessor, and/or other similar functioned circuits. A control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit.

For purposes of this document, the term "apparatus" can include, but is not limited to, one or more of, storage system 100, storage 130, memory die 200, integrated memory assembly 207, and/or control die 211.

Figure 3A:
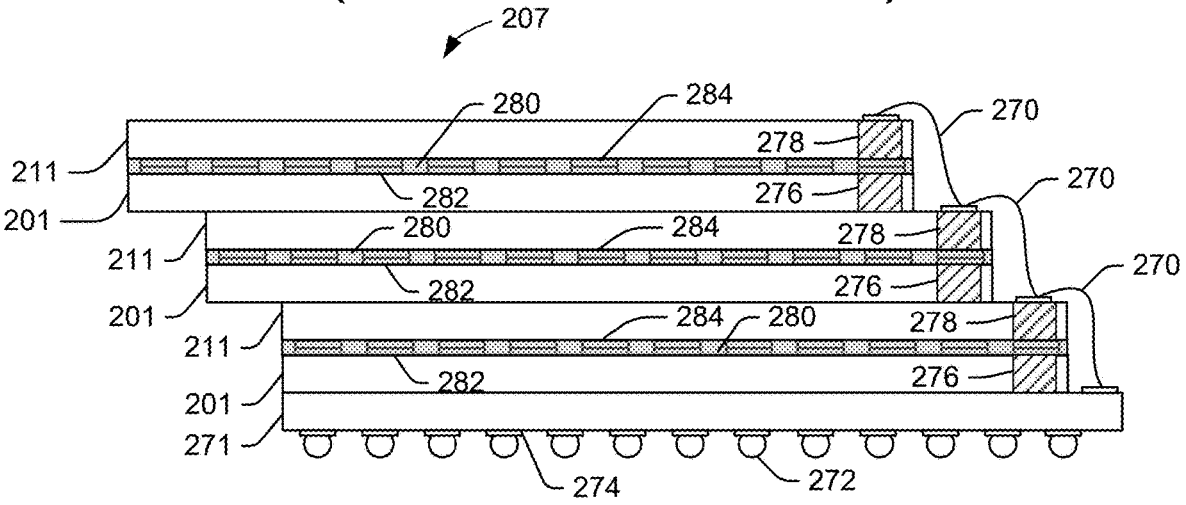
FIGS. 3A and 3B depict different embodiments of integrated memory assemblies.

In some embodiments, there is more than one control die 211 and more than one memory structure die 201 in an integrated memory assembly 207. In some embodiments, the integrated memory assembly 207 includes a stack of multiple control dies 211 and multiple memory structure dies 201. FIG. 3A depicts a side view of an embodiment of an integrated memory assembly 207 stacked on a substrate 271 (e.g., a stack comprising control die 211 and memory structure die). The integrated memory assembly 207 has three control dies 211 and three memory structure dies 201. In some embodiments, there are more than three memory structure dies 201 and more than three control dies 211. In FIG. 3A there are an equal number of memory structure dies 201 and control dies 211; however, in one embodiment, there are more memory structure dies 201 than control dies 211. For example, one control die 211 could control multiple memory structure dies 201.

Each control die 211 is affixed (e.g., bonded) to at least one of the memory structure die 201. Some of the bond pads 282/284 are depicted. There may be many more bond pads. A space between two die 201, 211 that are bonded together is filled with a solid layer 280, which may be formed from epoxy or other resin or polymer. This solid layer 280 protects the electrical connections between the die 201, 211, and further secures the die together. Various materials may be used as solid layer 280.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory structure die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
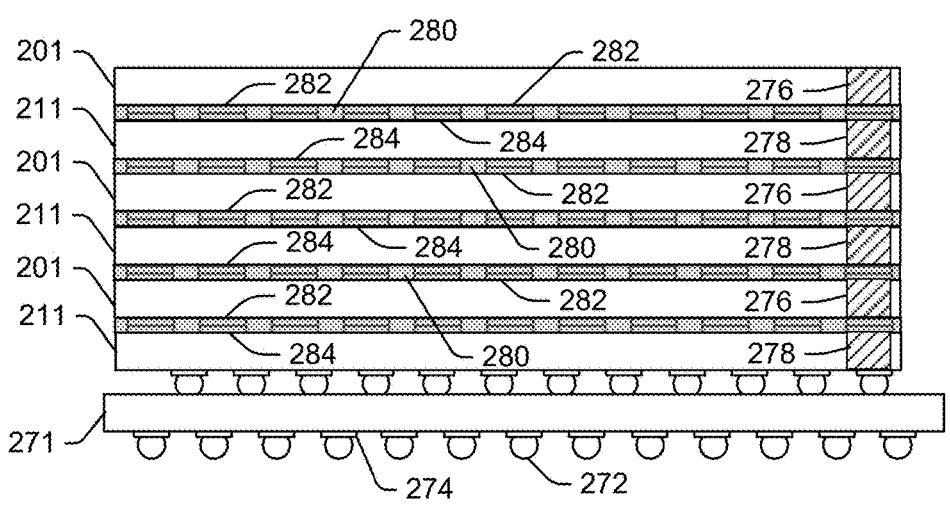

FIG. 3B depicts a side view of another embodiment of an integrated memory assembly 207 stacked on a substrate 271. The integrated memory assembly 207 of FIG. 3B has three control dies 211 and three memory structure dies 201. In some embodiments, there are many more than three memory structure dies 201 and many more than three control dies 211. In this example, each control die 211 is bonded to at least one memory structure die 201. Optionally, a control die 211 may be bonded to two or more memory structure dies 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory structure die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory structure die 201 may be bonded together. Bond pads on each die 201, 211 may be used to bond the two die together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor die together. The size of, and pitch between, bond pads may be further reduced by providing a film layer on the surfaces of the semiconductor die including the bond pads. The film layer is provided around the bond pads. When the die are brought together, the bond pads may bond to each other, and the film layers on the respective die may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller sizes and pitches.

Some embodiments may include a film on surface of the dies 201, 211. Where no such film is initially provided, a space between the die may be under filled with an epoxy or other resin or polymer. The under-fill material may be applied as a liquid which then hardens into a solid layer. This under-fill step protects the electrical connections between the dies 201, 211, and further secures the die together. Various materials may be used as under-fill material.

Figure 3C:
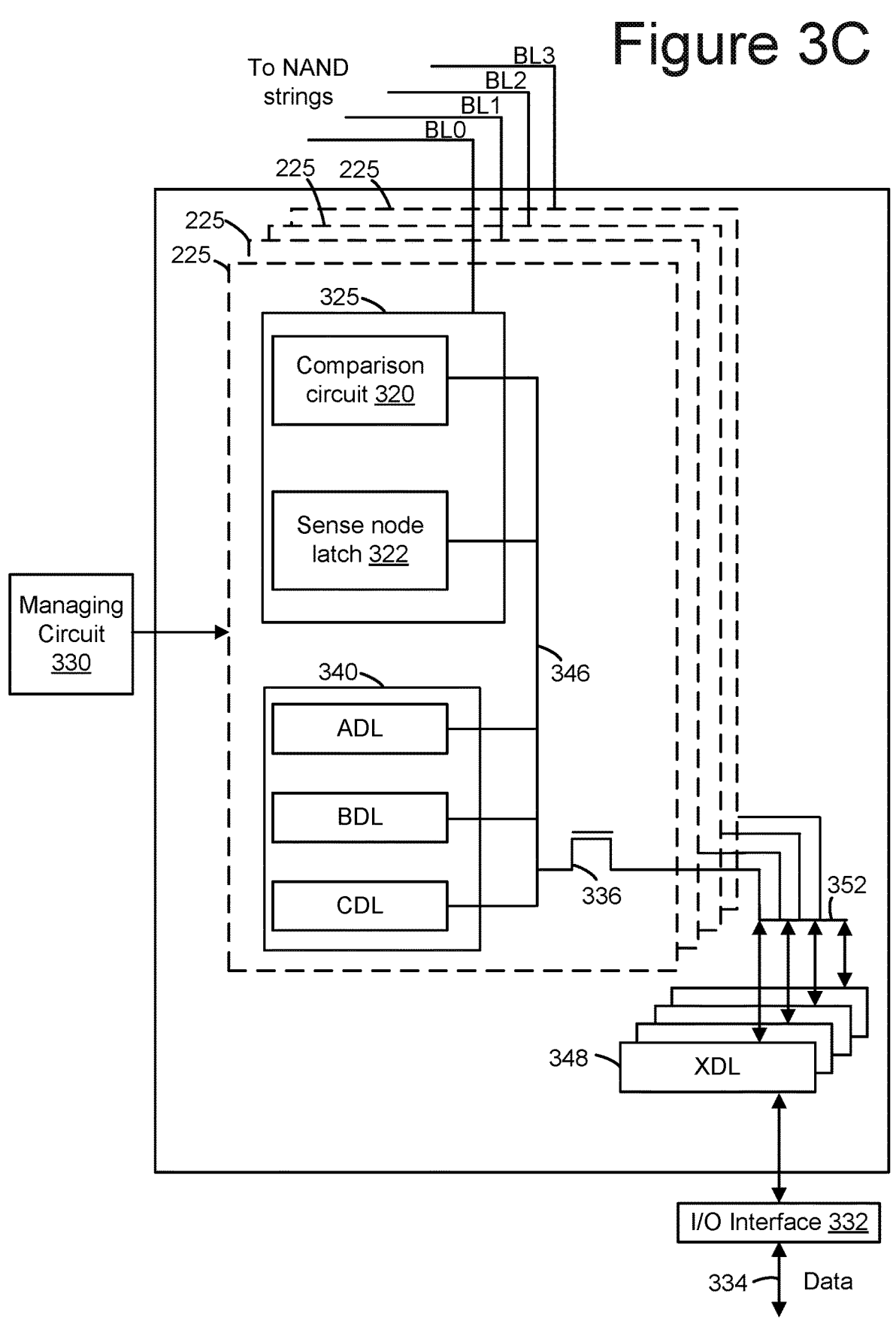
FIG. 3C is a block diagram depicting one embodiment of a portion of column control circuitry that contains a number of read/write circuits.

FIG. 3C is a block diagram depicting one embodiment of a portion of column control circuitry 210 that contains a number of read/write circuits 225. Each read/write circuit 225 is partitioned into a sense amplifier 325 and data latches 340. A managing circuit 330 controls the read/write circuits 225. The managing circuit 330 may communicate with state machine 262. In one embodiment, each sense amplifier 325 is connected to a respective bit line. Each bit line may be connected, at one point in time, to one of a large number of different NAND strings. A select gate on the NAND string may be used to connect the NAND string channel to the bit line.

Each sense amplifier 325 operates to provide voltages to one of the bit lines (see BL0, BL1, BL2, BL3) during program, verify, erase, and read operations. Sense amplifiers are also used to sense the condition (e.g., data state) of a memory cell in a NAND string connected to the bit line that connects to the respective sense amplifier.

Each sense amplifier 325 may have a sense node. During sensing, a sense node is charged up to an initial voltage, Vsense_init, such as 3V. The sense node is then connected to the bit line for a sensing time, and an amount of decay of the sense node is used to determine whether a memory cell is in a conductive or non-conductive state. The amount of decay of the sense node also indicates whether a current Icell in the memory cell exceeds a reference current, Iref. A larger decay corresponds to a larger current. If Icell<=Iref, the memory cell is in a non-conductive state and if Icell>Iref, the memory cell is in a conductive state. In an embodiment, the sense node has a capacitor that is pre-charged and then discharged for the sensing time.

In particular, the comparison circuit 320 determines the amount of decay by comparing the sense node voltage to a trip voltage after the sensing time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the verify voltage. A sense node latch 322 is set to 0 or 1, for example, by the comparison circuit 320 based on whether the memory cell is in a conductive or non-conductive state, respectively. The bit in the sense node latch 322 can also be used in a lockout scan to decide whether to set a bit line voltage to an inhibit or a program enable level in a next program loop. The bit in the sense node latch 322 can also be used in a lockout mode to decide whether to set a bit line voltage to a sense voltage or a lockout voltage in a read operation.

The data latches 340 are coupled to the sense amplifier 325 by a local data bus 346. The data latches 340 include three latches (ADL, BDL, CDL) for each sense amplifier 325 in this example. More or fewer than three latches may be included in the data latches 340. In one embodiment, for programming each data latch 340 is used to store one bit to be stored into a memory cell and for reading each data latch 340 is used to store one bit read from a memory cell. In a three bit per memory cell embodiment, ADL stores a bit for a lower page of data, BDL stores a bit for a middle page of data, CDL stores a bit for an upper page of data. Each read/write circuit 225 is connected to an XDL latch 348 by way of an XDL bus 352. In this example, transistor 336 connects local data bus 346 to XDL bus 352. An I/O interface 332 is connected to the XDL latches 348. The XDL latch 348 associated with a particular read/write circuit 225 serves as an interface latch for storing/latching data from the memory controller.

Managing circuit 330 performs computations, such as to determine the data stored in the sensed memory cell and store the determined data in the set of data latches. Each set of data latches 340 is used to store data bits determined by managing circuit 330 during a read operation, and to store data bits imported from the data bus 334 during a program operation which represent write data meant to be programmed into the memory. I/O interface 332 provides an interface between XDL latches 348 and the data bus 334.

During reading, the operation of the system is under the control of state machine 262 that controls the supply of different control gate voltages to the addressed memory cell. As it steps through the various predefined control gate voltages corresponding to the various memory states supported by the memory, the sense circuit may trip at one of these voltages and a corresponding output will be provided from the sense amplifier to managing circuit 330. At that point, managing circuit 330 determines the resultant memory state by consideration of the tripping event(s) of the sense circuit and the information about the applied control gate voltage from the state machine. It then computes a binary encoding for the memory state and stores the resultant data bits into data latches 340.

During program or verify operations for memory cells, the data to be programmed (write data) is stored in the set of data latches 340 from the data bus 334 by way of XDL latches 348. The program operation, under the control of the state machine 262, applies a series of programming voltage pulses to the control gates of the addressed memory cells. Each voltage pulse may be stepped up in magnitude from a previous program pulse by a step size in a process referred to as incremental step pulse programming. In one embodiment, each program voltage is followed by a verify operation to determine if the memory cells have been programmed to the desired memory state. In some cases, managing circuit 330 monitors the read back memory state relative to the desired memory state. When the two agree, managing circuit 330 sets the bit line in a program inhibit mode such as by updating its latches. This inhibits the memory cell coupled to the bit line from further programming even if additional program pulses are applied to its control gate.

Figure 4:
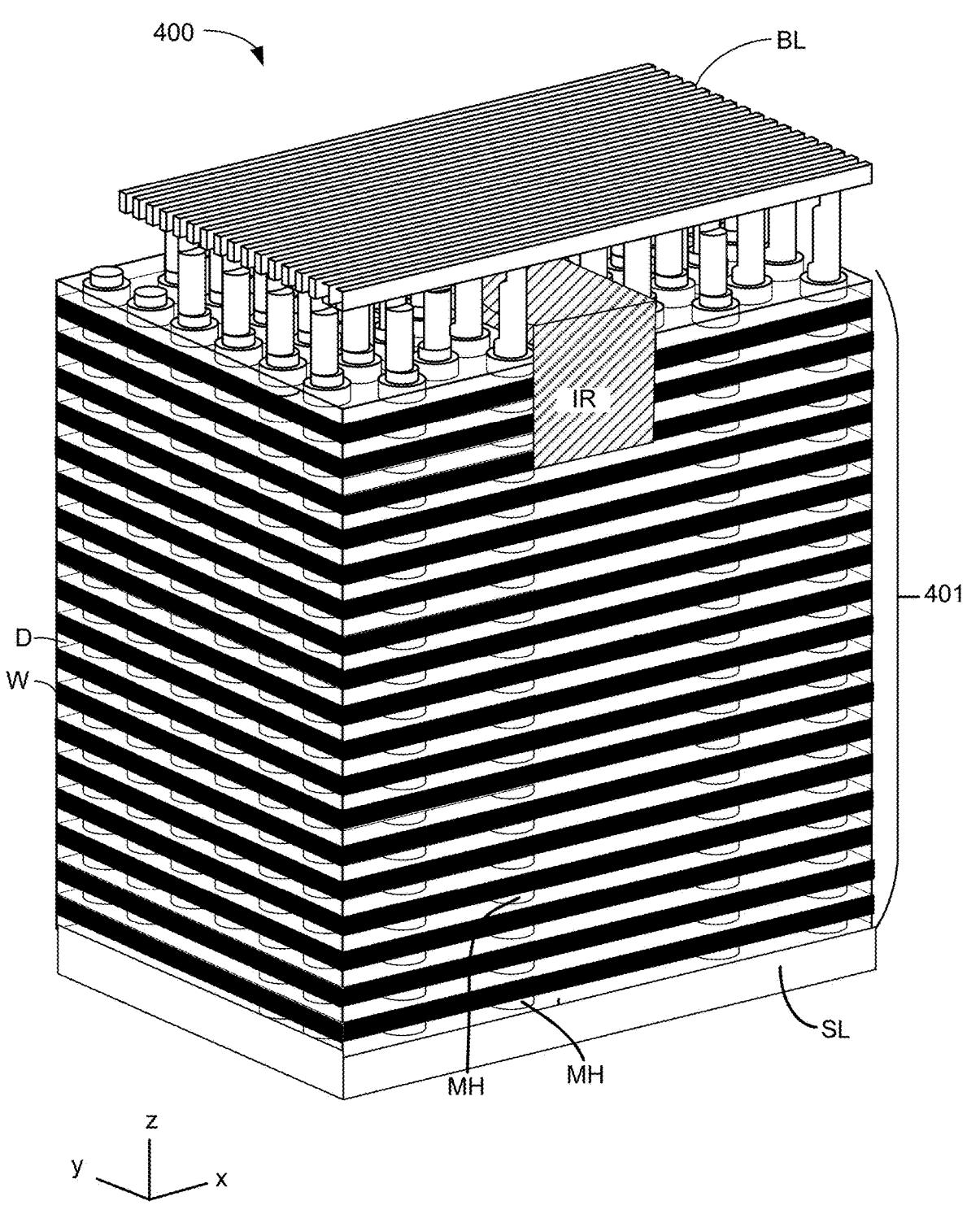
FIG. 4 is a perspective view of a portion of one example embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. In one embodiment the alternating dielectric layers and conductive layers are divided into four (or a different number of) regions (e.g., sub-blocks) by isolation regions IR. FIG. 4 shows one isolation region IR separating two sub-blocks. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

Figure 4A:
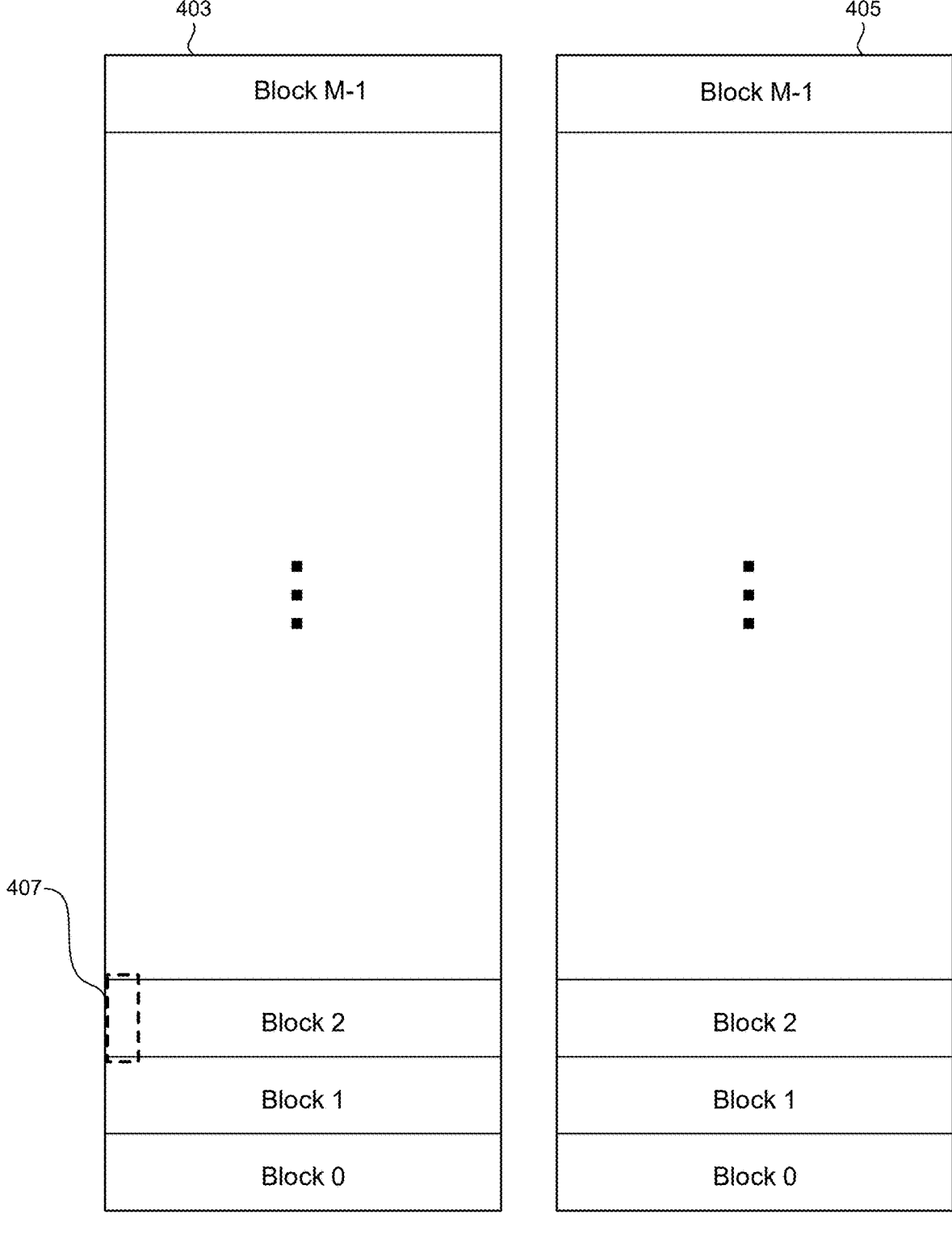
FIG. 4A is a block diagram of one embodiment of a memory structure having two planes.

FIG. 4A is a block diagram explaining one example organization of memory structure 202, which is divided into two planes 403 and 405. Each plane is then divided into M physical blocks. In one example, each plane has about 2000 physical blocks (or more briefly "blocks"). However, different numbers of blocks and planes can also be used. In one embodiment, a block of memory cells is a unit of erase. That is, all memory cells of a block are erased together. In other embodiments, blocks can be divided into sub-blocks and the sub-blocks can be the unit of erase. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all of the vertical NAND strings for that block. Although FIG. 4A shows two planes 403/405, more or fewer than two planes can be implemented. In some embodiments, memory structure 202 includes four planes. In some embodiments, memory structure 202 includes eight planes. In some embodiments, programming can be performed in parallel in a first selected block in plane 403 and a second selected block in plane 405.

Figure 4B:
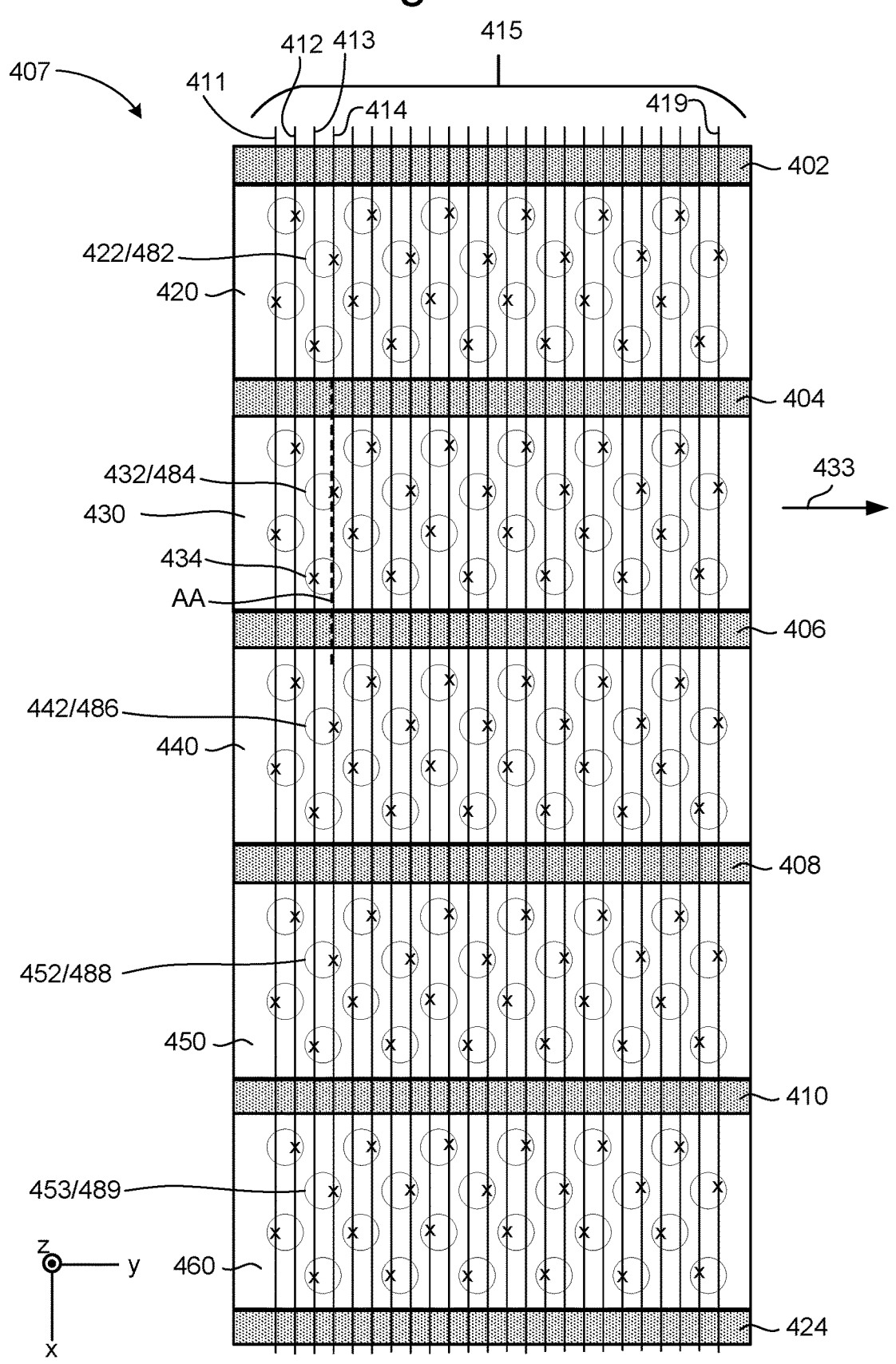
FIG. 4B is a block diagram depicting a top view of a portion of block of memory cells.

FIGS. 4B-4E depict an example three dimensional ("3D") NAND structure that corresponds to the structure of FIG. 4 and can be used to implement memory structure 202 of FIGS. 2A and 2B. FIG. 4B is a diagram depicting a top view of a portion 407 of Block 2. As can be seen from FIG. 4B, the physical block depicted in FIG. 4B extends in the direction of arrow 433. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442, 452 and 453. Vertical column 422 implements NAND string 482. Vertical column 432 implements NAND string 484. Vertical column 442 implements NAND string 486. Vertical column 452 implements NAND string 488. Vertical column 453 implements NAND string 486. Vertical column 452 implements NAND string 489. More details of the vertical columns are provided below. Since the physical block depicted in FIG. 4B extends in the direction of arrow 433, the physical block includes more vertical columns than depicted in FIG. 4B.

FIG. 4B also depicts a set of bit lines 415, including bit lines 411, 412, 413, 414, . . . 419. FIG. 4B shows twenty-four bit lines because only a portion of the block is depicted. It is contemplated that more than twenty-four bit lines connected to vertical columns of the physical block. Each of the circles representing vertical columns has an "x" to indicate its connection to one bit line. For example, bit line 414 is connected to vertical columns 422, 432, 442 and 452.

The block depicted in FIG. 4B includes a set of isolation regions 402, 404, 406, 408, 410, and 424, which are formed of SiO$_2$; however, other dielectric materials can also be used. Isolation regions 402, 404, 406, 408, 410, and 424 serve to divide the top layers of the physical block into five regions; for example, the top layer depicted in FIG. 4B is divided into regions 420, 430, 440, 450, and 460 of which are referred to as sub-blocks. In one embodiment, isolation regions 402 and

424 separate the physical block from adjacent physical blocks. Thus, isolation regions 402 and 424 may extend down to the substrate. In one embodiment, the isolation regions 404, 406, and 410 only divide the layers used to implement select gates so that NAND strings in different sub-blocks can be independently selected. Referring back to FIG. 4, the IR region may correspond to any of isolation regions 404, 406, 408, or 410. In one example implementation, a bit line only connects to one vertical column/NAND string in each of regions (sub-blocks) 420, 430, 440, 450, and 460. In that implementation, each physical block has twenty rows of active columns and each bit line connects to five rows in each block. In one embodiment, all of the five vertical columns/NAND strings connected to a common bit line are connected to the same word line (or set of word lines); therefore, the system uses the drain side selection lines to choose one (or another subset) of the five to be subjected to a memory operation (program, verify, read, and/or erase).

Although FIG. 4B shows each region (420, 430, 440, 450, 460) having four rows of vertical columns, five regions (420, 430, 440, 450, 460) and twenty rows of vertical columns in a block, those exact numbers are an example implementation. Other embodiments may include more or fewer regions (420, 430, 440, 450, 460) per block, more or fewer rows of vertical columns per region and more or fewer rows of vertical columns per block. FIG. 4B also shows the vertical columns being staggered. In other embodiments, different patterns of staggering can be used. In some embodiments, the vertical columns are not staggered.

Figure 4C:
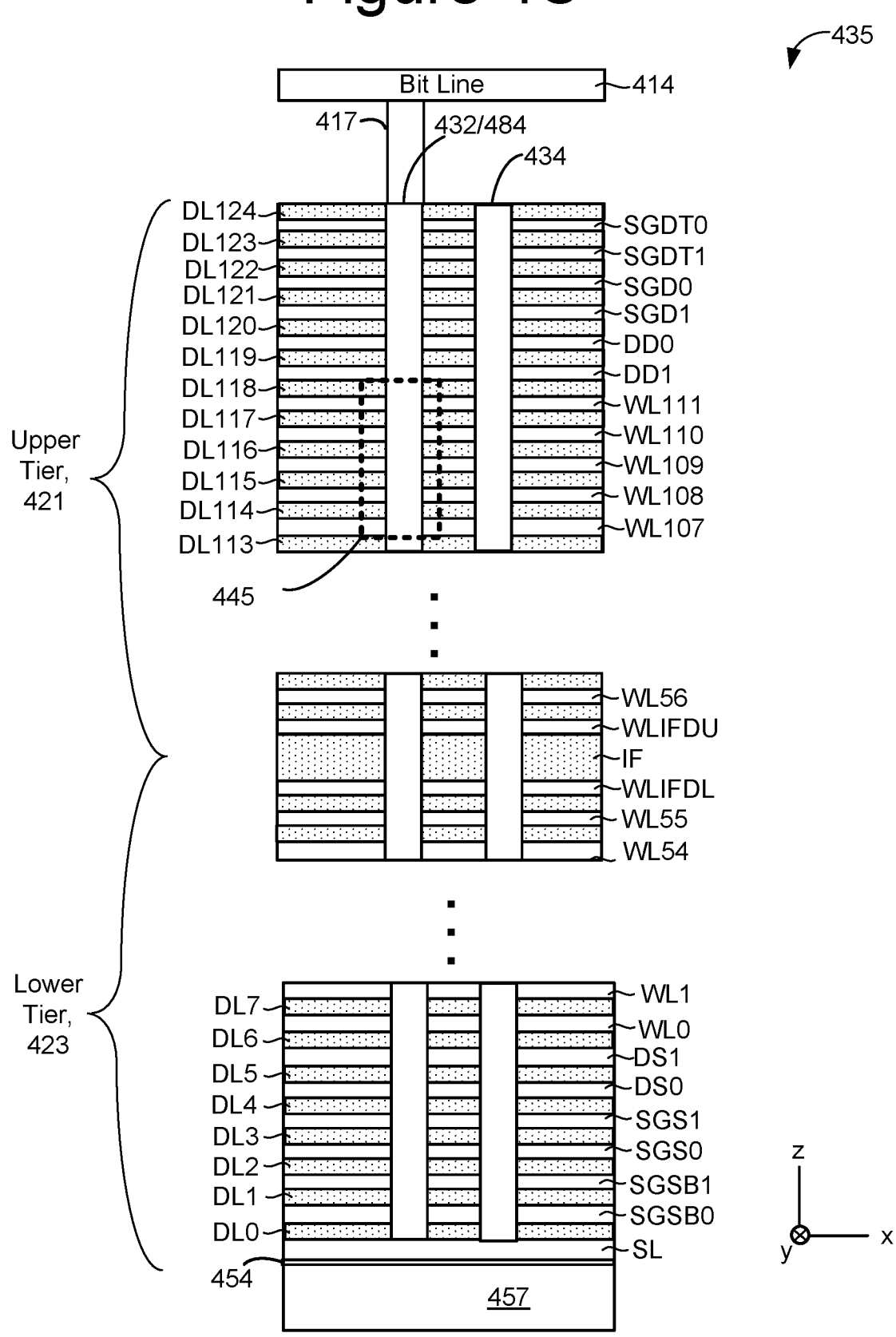
FIG. 4C depicts an embodiment of a stack showing a cross-sectional view along line AA of FIG. 4B.

FIG. 4C depicts an example of a stack 435 showing a cross-sectional view along line AA of FIG. 4B. The SGD layers include SGDT0, SGDT1, SGD0, and SGD1. The SGD layers may have more or fewer than four layers. The SGS layers includes SGSB0, SGSB1, SGS0, and SGS1. The SGS layers may have more or fewer than four layers. Six dummy word line layers DD0, DD1, WLIFDU, WLIDDL, DS1, and DS0 are provided, in addition to the data word line layers WL0-WL111. There may be more or fewer than 112 data word line layers and more or fewer than four dummy word line layers. Each NAND string has a drain side select gate at the SGD layers. Each NAND string has a source side select gate at the SGS layers. Also depicted are dielectric layers DL0-DL124.

Columns 432, 434 of memory cells are depicted in the multi-layer stack. The stack includes a substrate 457, an insulating film 454 on the substrate, and a portion of a source line SL. A portion of the bit line 414 is also depicted. Note that NAND string 484 is connected to the bit line 414. NAND string 484 has a source-end at a bottom of the stack and a drain-end at a top of the stack. The source-end is connected to the source line SL. A conductive via 417 connects the drain-end of NAND string 484 to the bit line 414.

In one embodiment, the memory cells are arranged in NAND strings. The word line layers WL0-WL111 connect to memory cells (also called data memory cells). Dummy word line layers DD0, DD1, DS0 and DS1 connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. Drain side select layers SGD are used to electrically connect and disconnect (or cut off) the channels of respective NAND strings from bit lines. Source side select layers SGS are used to electrically connect and disconnect (or cut off) the channels of respective NAND strings from the source line SL.

FIG. 4C depicts an example of a stack 435 having two tiers. The two-tier stack comprises an upper tier 421 and a lower tier 423. A two-tier other multi-tier stack can be used to form a relatively tall stack while maintaining a relatively narrow memory hole width (or diameter). After the layers of the lower tier are formed, memory hole portions are formed in the lower tier. Subsequently, after the layers of the upper tier are formed, memory hole portions are formed in the upper tier, aligned with the memory hole portions in the lower tier to form continuous memory holes from the bottom to the top of the stack. The resulting memory hole is narrower than would be the case if the hole were etched from the top to the bottom of the stack rather than in each tier individually. An interface (IF) region is created where the two tiers are connected. The IF region is typically thicker than the other dielectric layers. Due to the presence of the IF region, the adjacent word line layers suffer from edge effects such as difficulty in programming or erasing. These adjacent word line layers can therefore be set as dummy word lines (WLIFDL, WLIFDU). In some embodiments, the upper tier 421 and the lower tier 423 are erased independent of one another. Hence, data may be maintained in the lower tier 423 after the upper tier 421 is erased. Likewise, data may be maintained in the upper tier 421 after the lower tier 423 is erased.

Figure 4D:
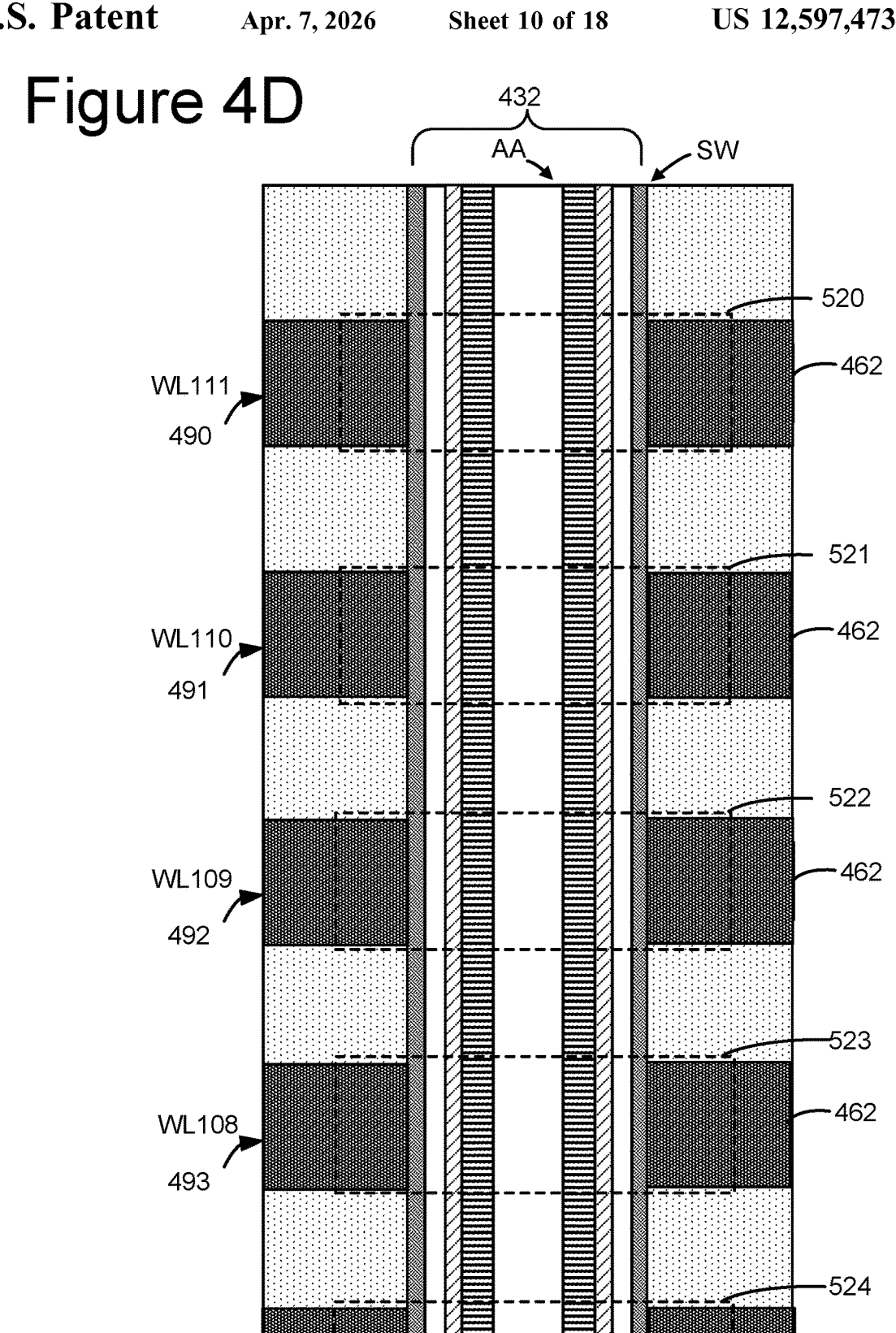
FIG. 4D depicts a view of the region 445 of FIG. 4C.

FIG. 4D depicts a view of the region 445 of FIG. 4C. Data memory cell transistors 520, 521, 522, 523, and 524 are indicated by the dashed lines. A number of layers can be deposited along the sidewall (SW) of the memory hole 432 and/or within each word line layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A word line layer can include a conductive metal 462 such as Tungsten as a control gate. For example, control gates 490, 491, 492, 493 and 494 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Each of the memory holes can be filled with a plurality of annular layers (also referred to as memory film layers) comprising a blocking oxide layer, a charge trapping layer, a tunneling layer and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

Figure 4E:
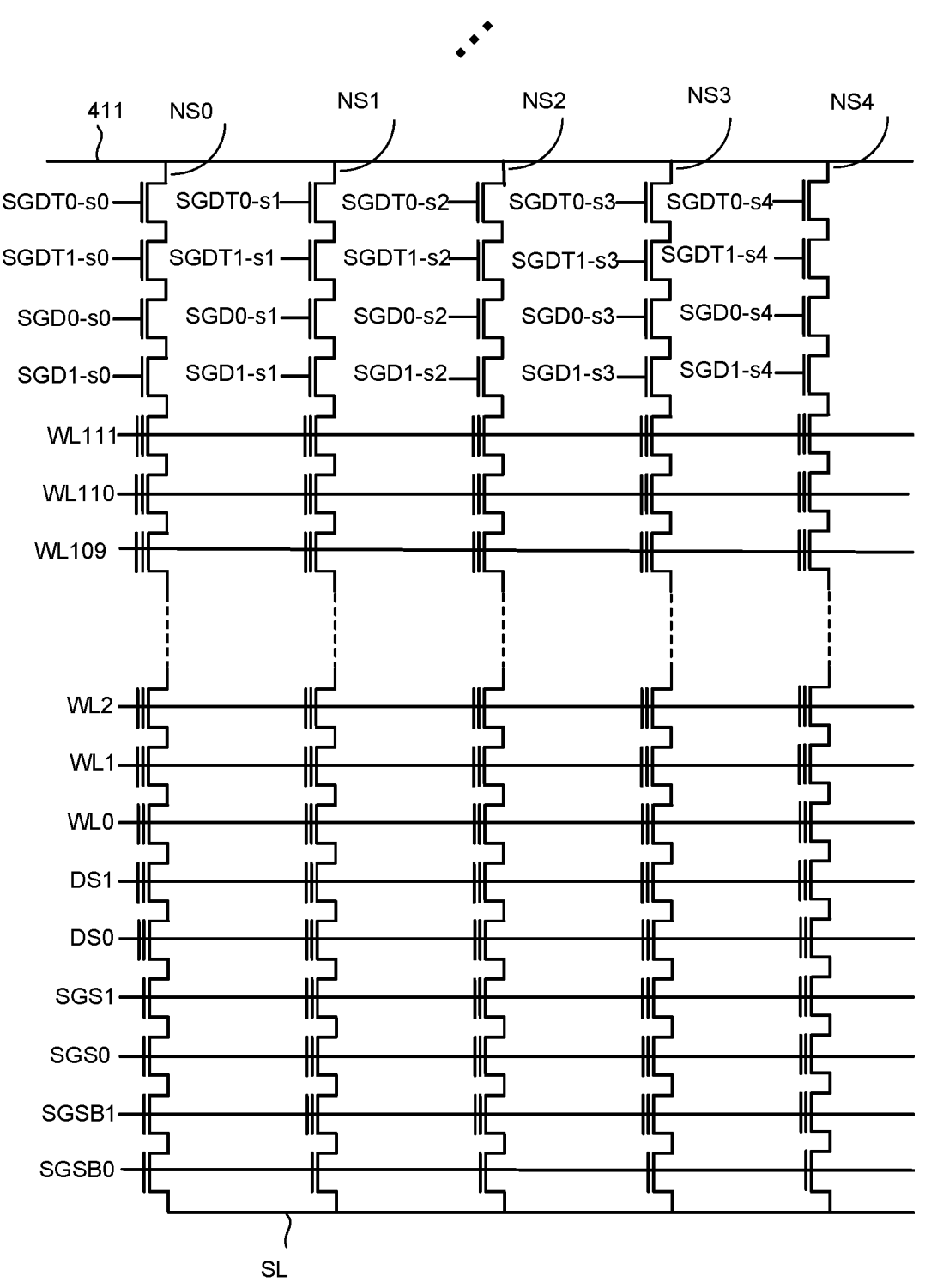
FIG. 4E is a schematic diagram of a portion of one embodiment of a block, depicting several NAND strings.

FIG. 4E is a schematic diagram of a portion of the memory array 202. FIG. 4E shows physical data word lines WL0-WL111 running across the entire block. The structure of FIG. 4E corresponds to a portion 407 in Block 2 of FIG.

4A, including bit line 411. Within the physical block, in one embodiment, each bit line is connected to five NAND strings. Thus, FIG. 4E shows bit line 411 connected to NAND string NS0, NAND string NS1, NAND string NS2, NAND string NS3, and NAND string NS4.

In one embodiment, there are five sets of drain side select lines in the block. For example, the set of drain side select lines connected to NS0 include SGDT0-s0, SGDT1-s0, SGD0-s0, and SGD1-s0. The set of drain side select lines connected to NS1 include SGDT0-s1, SGDT1-s1, SGD0-s1, and SGD1-s1. The set of drain side select lines connected to NS2 include SGDT0-s2, SGDT1-s2, SGD0-s2, and SGD1-s2. The set of drain side select lines connected to NS3 include SGDT0-s3, SGDT1-s3, SGD0-s3, and SGD1-s3. The set of drain side select lines connected to NS4 include SGDT0-s4, SGDT1-s4, SGD0-s4, and SGD1-s4. Herein the term "SGD" may be used as a general term to refer to any one or more of the lines in a set of drain side select lines. Each set drain side select lines connects to a group of NAND strings in the block. Only one NAND string of each group is depicted in FIG. 4E. These five sets of drain side select lines correspond to five sub-blocks. A first sub-block corresponds to those vertical NAND strings controlled by SGDT0-s0, SGDT1-s0, SGD0-s0, and SGD1-s0. A second sub-block corresponds to those vertical NAND strings controlled by SGDT0-s1, SGDT1-s1, SGD0-s1, and SGD1-s1. A third sub-block corresponds to those vertical NAND strings controlled by SGDT0-s2, SGDT1-s2, SGD0-s2, and SGD1-s2. A fourth sub-block corresponds to those vertical NAND strings controlled by SGDT0-s3, SGDT1-s3, SGD0-s3, and SGD1-s3. A fifth sub-block corresponds to those vertical NAND strings controlled by SGDT0-s4, SGDT1-s4, SGD0-s4, and SGD1-s4. As noted, FIG. 4E only shows the NAND strings connected to bit line 411. However, a full schematic of the block would show every bit line and five vertical NAND strings connected to each bit line.

In one embodiment, all of the memory cells on the NAND strings in a block are erased as a unit. However in some embodiments, a block is operated as an upper tier and a lower tier, wherein the upper tier and the lower tier each form an erase unit. For example, memory cells connected to WL0-WL55 may be in the lower tier 423 and memory cells connected to WL56-WL111 may be in the upper tier 421. Hence, memory cells connected to WL0-WL55 may be in one erase unit and memory cells connected to WL56-WL111 may be in another erase unit. A block could be operated in more than two tiers. Erase units can be formed based on other divisions of blocks.

Although the example memories of FIGS. 4-4E are three dimensional memory structure that includes vertical NAND strings with charge-trapping material, other 3D memory structures can also be used with the technology described herein.

Figures 5A, 5B:
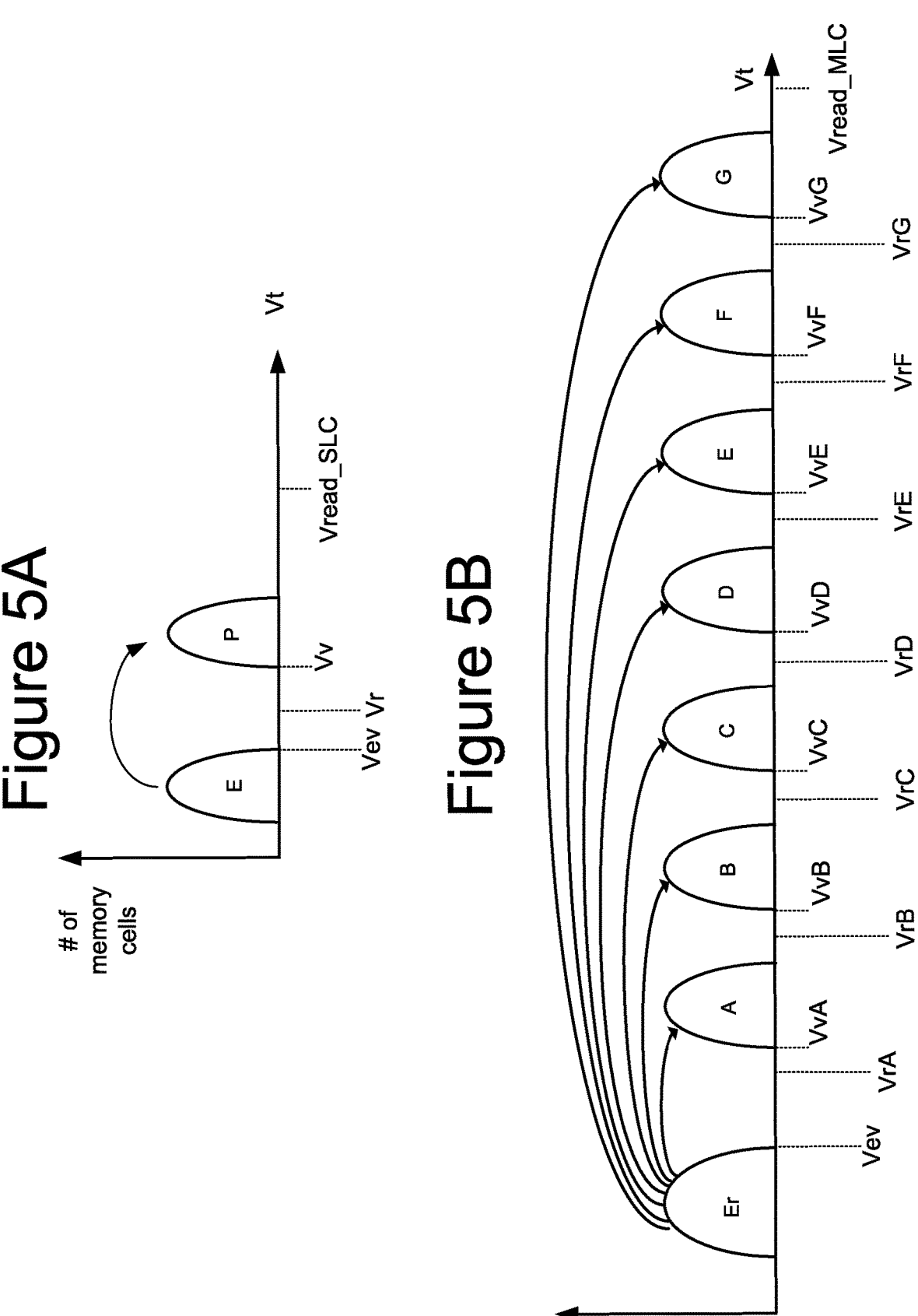
FIGS. 5A and 5B depicts threshold voltage distributions.

The storage systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate. FIG. 5A is a graph of threshold voltage versus number of memory cells, and illustrates example threshold voltage distributions for the memory array when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 5A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 5A depicts read reference voltage Vr. By testing (e.g., performing one or more sense operations) whether the threshold voltage of a given memory cell is above or below Vr, the system can determine a memory cells is erased (state E) or programmed (state P). FIG. 5A also depicts verify reference voltage Vv. In some embodiments, when programming memory cells to data state P, the system will test whether those memory cells have a threshold voltage greater than or equal to Vv. The voltage Vread_SLC is an example magnitude for a read pass voltage that may be applied to unselected word lines when reading SLC cells. Note that Vread_SLC is significantly greater than the P-state Vt distribution.

Memory cells that store multiple bit per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data. In the example embodiment of FIG. 5B, each memory cell stores three bits of data. Other embodiments may use other data capacities per memory cell (e.g., such as two, four, or five bits of data per memory cell).

FIG. 5B shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. In an embodiment, the number of memory cells in each state is about the same.

FIG. 5B shows seven read reference voltages, VrA, VrB, VrC, VrD, VrE, VrF, and VrG for reading data from memory cells. By testing (e.g., performing sense operations) whether the threshold voltage of a given memory cell is above or below the seven read reference voltages, the system can determine what data state (i.e., A, B, C, D, . . . ) a memory cell is in. FIG. 5B also shows a number of verify reference voltages. The verify reference voltages are VvA, VvB, VvC, VvD, VvE, VvF, and VvG. In some embodiments, when programming memory cells to data state A, the system will test whether those memory cells have a threshold voltage greater than or equal to VvA. If the memory cell has a threshold voltage greater than or equal to VvA, then the memory cell is locked out from further programming. Similar reasoning applies to the other data states. The voltage Vread_MLC is an example magnitude for a read pass voltage that may be applied to unselected word lines when reading MLC cells. Note that Vread_MLC is significantly greater than the G-state Vt distribution.

Figure 6:
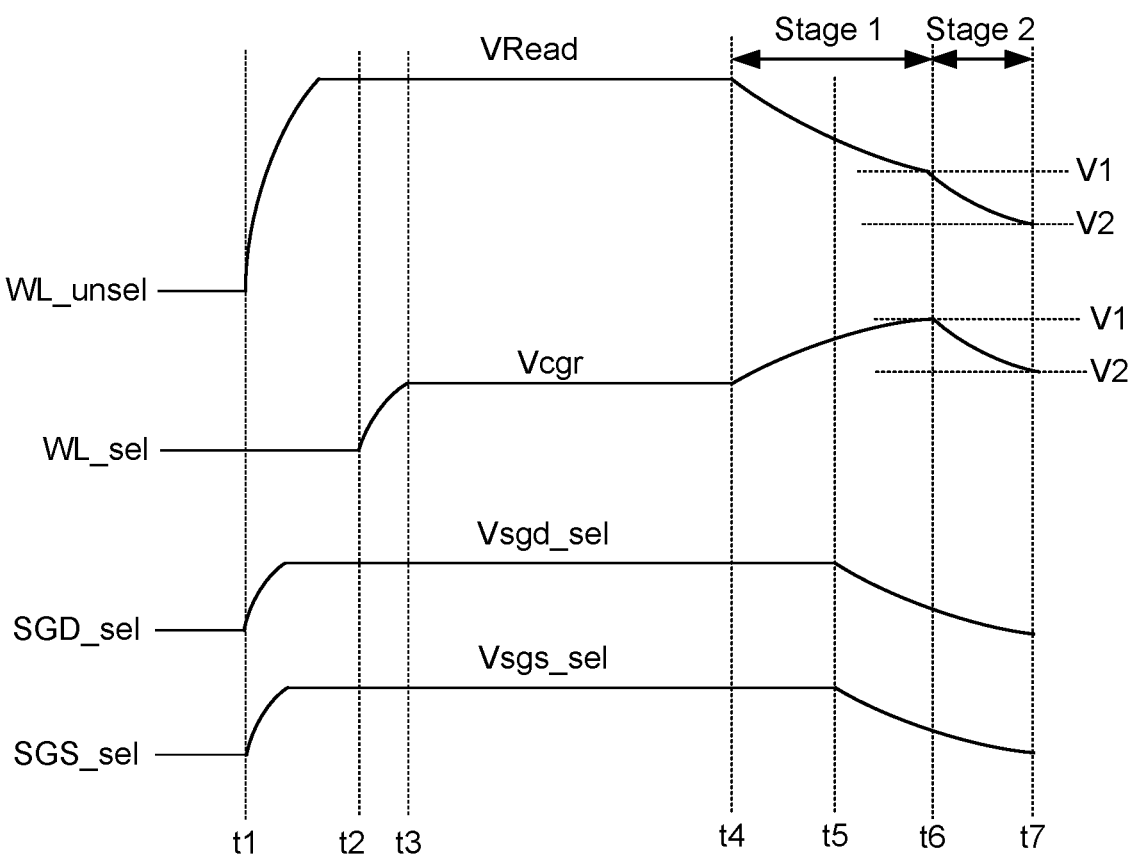
FIG. 6 is a diagram illustrating timing of voltages applied to word lines and select lines during an embodiment of read with multi-stage discharge of a read pass voltage.

FIG. 6 is a diagram illustrating timing of voltages applied to word lines and select lines during an embodiment of read. In an embodiment, the read operation is used to read NAND cells in a block or sub-block. Specifically, memory cells connected to one of the word lines (the selected word line) are read. The memory cells being read will be referred to as the "selected memory cells." The selected memory cells are on a group of NAND strings that may reside in a sub-block or in some cases an entire block. In an embodiment, the SGD line is used to select the group of NAND strings. For example, with reference to the example in FIG. 4E, the five different SGD lines may be used to select one of the five sub-blocks, with the other four sub-blocks being unselected. Within the selected sub-block there may be selected memory cells (e.g., those connected to the selected word lines) and unselected memory cells (e.g., those connected to the unselected word lines). Thus, each NAND string in the selected sub-block may have one cell that is selected for read with the other memory cells on the NAND string being "unselected memory cells."

The read includes a two-stage (or two-step) discharge of the voltage on the unselected word lines (WL_unsel) at the end of the read. The selected memory cells are sensed between time t3 and t4 while the selected word line (WL_Sel) is at the read reference voltage (Vcgr) and the unselected word lines are at Vread. FIG. 6 also depicts the voltages to the selected drain side select lines (SGD_sel) and the selected source side select lines (SGS_sel).

During Stage 1, the voltage on the unselected word lines is reduced from Vread to an intermediate voltage (V1). Also during Stage 1, the voltage on the selected word line is changed (e.g., increased) from Vcgr to the intermediate voltage (V1). During Stage 2, the voltage on the unselected word lines is reduced from the intermediate voltage (V1) to a final voltage (V2). Also during Stage 2, the voltage on the selected word line is decreased from the intermediate voltage (V1) to the final voltage (V2). In an embodiment, the intermediate voltage is about half the magnitude of Vread. For example, Vread might have a magnitude of about 7V, with the intermediate voltage having a magnitude of about 3.5V. However, Vread could be greater or lower than 7V. Also, the intermediate voltage could be greater than 50% of Vread or less than 50% of Vread. In an embodiment, the final voltage has the magnitude of a power supply voltage. For example, the final voltage (V2) could be the power supply Vcc that is provided to the memory die. In some embodiments, the power control 264 generates an internal supply Vdd (which may be provided as the positive rail to various circuits on the memory die). In an embodiment, the final voltage (V2) is this internal supply Vdd. However, the final voltage (V2) is not required to be either Vcc or Vdd. Reducing the voltage on the unselected word lines in two stages may reduce peak current consumption during the final portion of the read operation.

Figure 7:
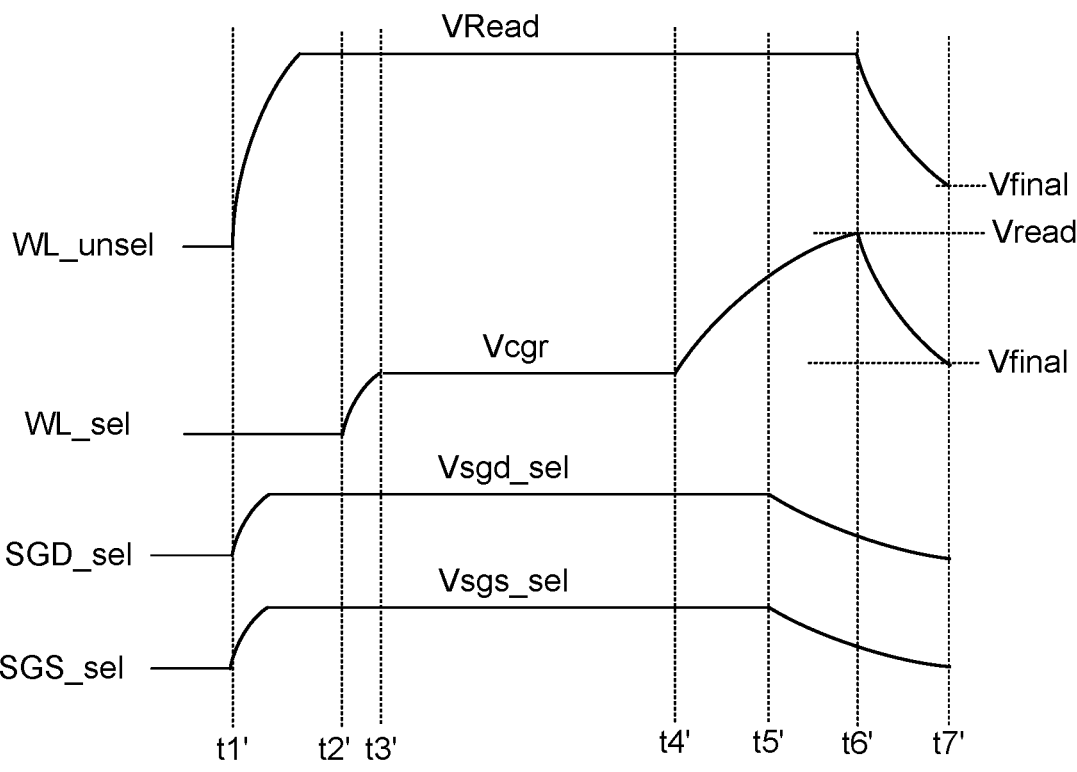
FIG. 7 is a diagram illustrating timing of voltages applied to word lines and select lines during one example of a conventional read.

FIG. 7 is a diagram illustrating timing of voltages applied to word lines and select lines during one example of a conventional read. The selected memory cells are sensed between time t3 and t4 while the selected word line (WL_Sel) is at the read reference voltage (Vcgr) and the unselected word lines are at Vread. After sensing the selected memory cells, the voltage on the selected word line is increased from Vcgr to Vread between t4 to t6. Between t6 and t7, the voltages on the unselected word lines and the selected word line are reduced from Vread to the final voltage (Vfinal). For purpose of comparison, the magnitude of Vread and Vcgr may be the same in the conventional read as in an embodiment depicted in FIG. 6. Also, the final voltage (Vfinal) in the conventional read in FIG. 7 could be about the same as the final voltage (V2) in an embodiment depicted in FIG. 6. However, an embodiment of the two-stage reduction in the voltage on the unselected word lines may have a significantly lower peak Icc relative to the example conventional read. Note that the voltage on the unselected word lines may be discharged more slowly in the two stage discharge in FIG. 6 relative to the conventional example in FIG. 7. Also note that the voltage on the selected word line is not raised all the way to Vread in the timing diagram depicted in FIG. 6.

Figure 8:
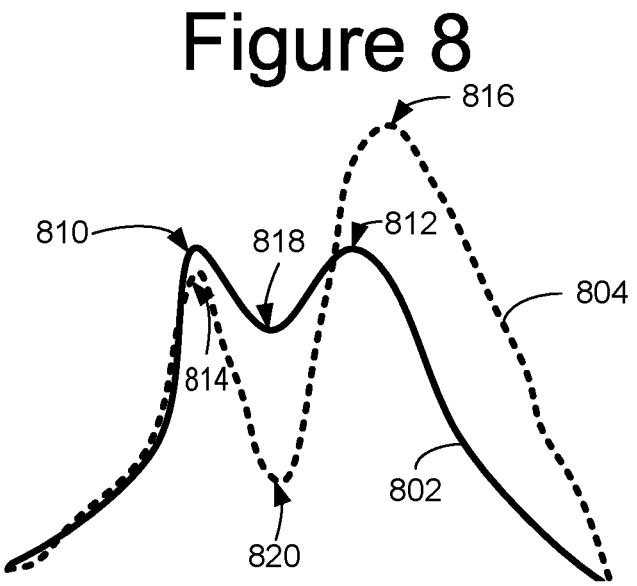
FIG. 8 depicts example current consumptions during final portions of read operations.

FIG. 8 depicts possible current consumptions during final portions of read operations. Curve 802 is a possible current consumption for an embodiment of two-stage discharge of the voltage on the unselected word lines. First peak current 810 and second peak current 812 may be associated with the discharge of the voltage on the word lines at the end of read. First peak current 810 could be associated with Stage 1 and second peak current 812 could be associated with Stage 2. Dashed curve 804 is a possible current consumption at the end of a conventional read. Peak current one 814 and peak current two 816 on dashed curve 804 may be due to the discharge of the word lines from Vread to Vfinal at the end of read. Note that peak current two 816 is significantly greater than peak current one 814. Therefore, reducing peak current two 816 can reduce the overall peak current even if peak current one 814 were to be increased. It may be possible that the discharge during Stage 1 (see FIG. 6) results in first peak current 810 being greater than peak current one 814, but that is not a requirement. However, keeping second peak current 812 below peak current two 816 results in a lower peak current for an embodiment of two-stage Vread discharge than an example conventional single stage Vread discharge. Moreover, it is possible though not required that the two-stage valley 818 on curve 802 may be greater than the single-stage valley 820 on curve 804. Thus, note that the current consumption for curve 802 is more uniform than the current consumption for curve 804. In essence it may be stated that beginning to discharge Vread in Stage 1 takes advantage of the single-stage valley 820 on curve 804. Note that it is not required that the average current consumption is smaller for an embodiment of two-stage Vread discharge than the conventional example of single-stage Vread discharge. Note also that the total time for an embodiment of two-stage Vread discharge (e.g., t4 to t7 in FIG. 6) may be about the same as the total time for an example of convention single-stage Vread discharge (e.g., t4' to t7' in FIG. 7). However, it is not required that the total discharge times be about the same. Therefore, peak Icc may be reduced without an increase in read time.

Figure 9:
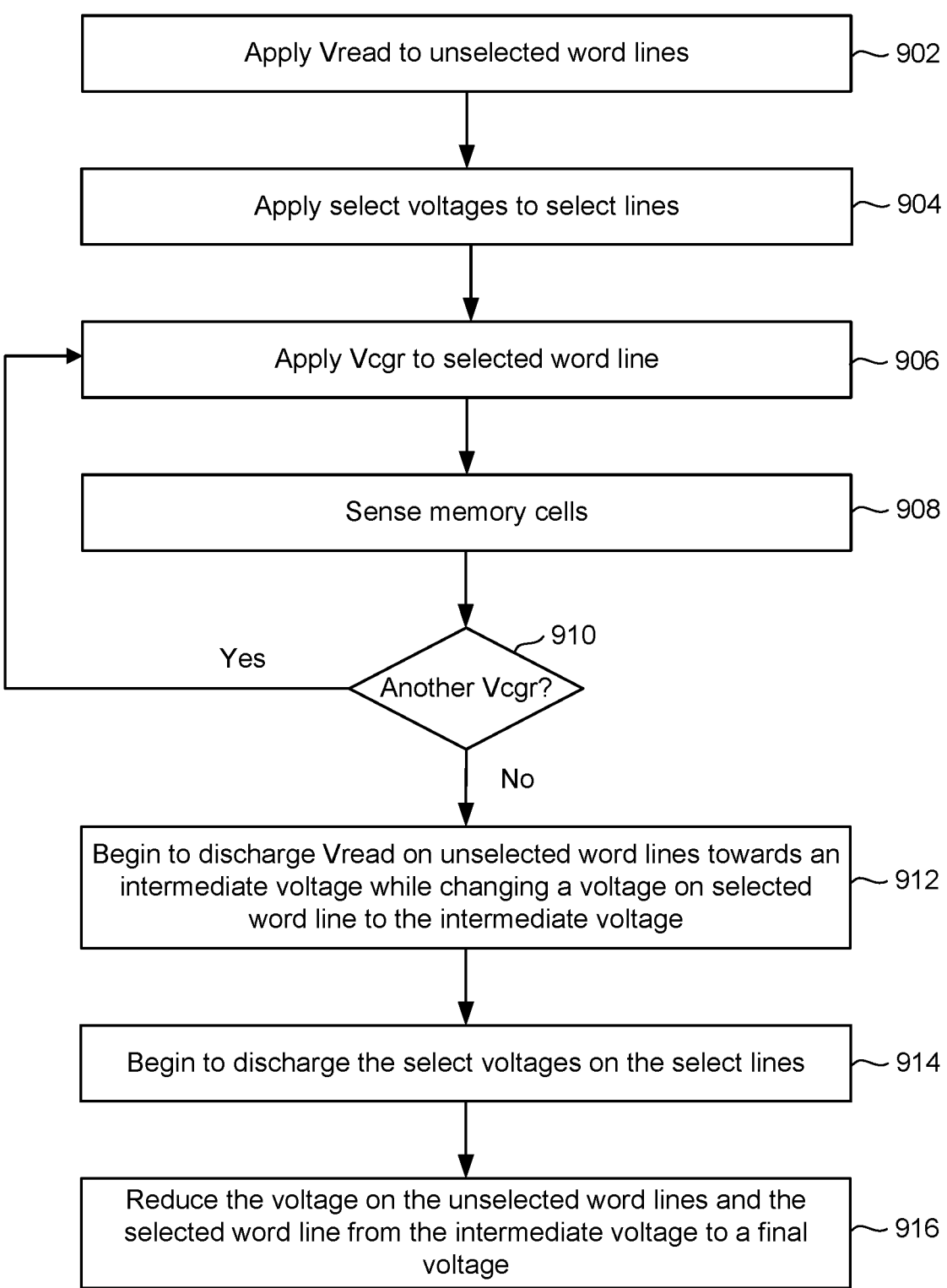
FIG. 9 is a flowchart of one embodiment of a process of reading memory cells with a multi-stage discharge of the voltage on unselected word lines.

FIG. 9 is a flowchart of one embodiment of a process 900 of reading memory cells with a multi-stage discharge of the voltage on unselected word lines. In an embodiment, the process 900 is performed by one or more control circuits that may include, but are not limited to, one or more of: system control logic 260, column control circuitry 210, and/or row control circuitry 220. The process 900 will be discussed with reference to the timing diagram in FIG. 6, although process 900 is not limited to those timings.

Step 902 includes applying a read pass voltage (e.g., Vread) to unselected word lines. With reference to FIG. 6, the voltage on the unselected word lines (WL_unsel) starts to ramp up a t1 to Vread. The voltage stays at Vread until t4.

Step 904 includes applying select voltages to select lines. With reference to FIG. 6, the voltage on the drain side select lines (SGD_sel) starts to ramp up at t1 to Vsgd_sel. The voltage on the source side select lines (SGS_sel) starts to ramp up at t1 to Vsgs_sel. Referring briefly to FIG. 4E, an example will be discussed in which the sub-block having NAND string NS0 (SB0) is selected and the other sub-blocks are not selected. The voltage SGD_sel may be applied to each of SGDT0-s0, SGDT1-s0, SGD0-s0, and SGD1-s0. The voltage SGD_sel will turn on each of SGDT0-s0, SGDT1-s0, SGD0-s0, and SGD1-s0 to connect the NAND channels in the selected sub-block to the corresponding bit lines. The voltage on the remaining SGD lines may be at a voltage that does not turn on those select transistors such that those sub-blocks (SB1, SB2, SB3, SB4) are not selected. Referring still to FIG. 4E, the voltage on SGS1, SGS0, SGSB1, and SGSB0 is at Vsgs_sel to turn on each of the source side select transistors. Note that the timing between ramping up Vread and ramping up the select line voltages can vary. Thus is it not required that Vread be ramped up simultaneously with ramping up the select line voltage. Also, more or fewer SGD transistors and/or SGS transistors per NAND string could be used.

Step 906 includes applying a read reference voltage (Vcgr) to the selected word line. Step 908 includes sensing the memory cells. Step 910 includes a determination of whether to applying another read reference voltage to the selected word line. If so, steps 906-908 are repeated to sense at another read reference voltage. Process 900 may be used to sense SLC cells or MLC cells. For example, with reference to FIG. 5A, Vcgr may be Vr to sense SLC cells. With reference to FIG. 5B, Vcgr could be any of VrA, VrB, VrC, VrD, VrE, VrF, or VrG. In some embodiments, process 900 will be used to sense one page (e.g., one bit per memory cell) by sensing at certain read reference voltages associated with that page. Further details of sensing at certain read reference voltages associated with a page are discussed below in connection with FIGS. 10, 11, and 12.

After sensing has been performed at all targeted read reference voltages, the voltage discharge phase may begin. Steps 912-916 describe one embodiment of the voltage discharge phase. Step 912 includes beginning to discharge Vread on the unselected word lines towards an intermediate voltage while changing the voltage on the selected word line to the intermediate voltage. In one embodiment, Vcgr is lower than the intermediate voltage in which case the voltage on the selected word line is increased in step 912. In one embodiment, Vcgr is higher than the intermediate voltage in which case the voltage on the selected word line is decreased in step 912. With reference to FIG. 6, at t4 the voltage on WL_unsel begins to be discharged towards the intermediate voltage (V1). This discharge occurs during what is labeled in FIG. 6 as Stage 1 (Stage 1 could also be called Step 1). Also at t1, the voltage on WL_sel begins to increase from Vcgr towards the intermediate voltage (V1). FIG. 1 depicts that both the unselected word line voltage and the selected word line voltage are at V1 at t6. It is not required that all word line voltage reach V1 at exactly V1. For example, it is possible that some word lines could reach V1 slightly prior to t6. However, in an embodiment, by the end of Stage 1 all word line voltages should be at V1.

Step 914 includes beginning to discharge the select voltages on the select lines. In an embodiment, the select voltage begin to discharge during Stage 1. In an embodiment, the select voltages begin to discharge after beginning to discharge the voltage on the unselected word lines (and after starting to change the voltage on the selected word line from Vdgr to the intermediate voltage). Moreover, the select voltages may begin to discharge prior to the end of Stage 1.

With reference to FIG. 6, at t5 the voltages on SGD_sel and SGS_sel each begin to discharge. This discharge could extend past the end of Stage 1, but is not required to extend past the end of Stage 1. As depicted in FIG. 6 the discharge of the select lines is allowed to extend to the end of Stage 2 to allow for a greater time to discharge the select lines.

Step 916 includes reducing the voltage on the unselected word lines and the selected word line from the intermediate voltage to the final voltage. With reference to FIG. 6, Stage 2 occurs between t6 to t7. In Stage 2, the voltage on WL_sel and WL_unsel is reduced from the intermediate voltage (V1) to the final voltage (V2). In one embodiment, after t7 the block, which had been selected, is no longer selected. Moreover, the voltage on the word lines may float after t7 when the block is no longer selected.

Figure 10:
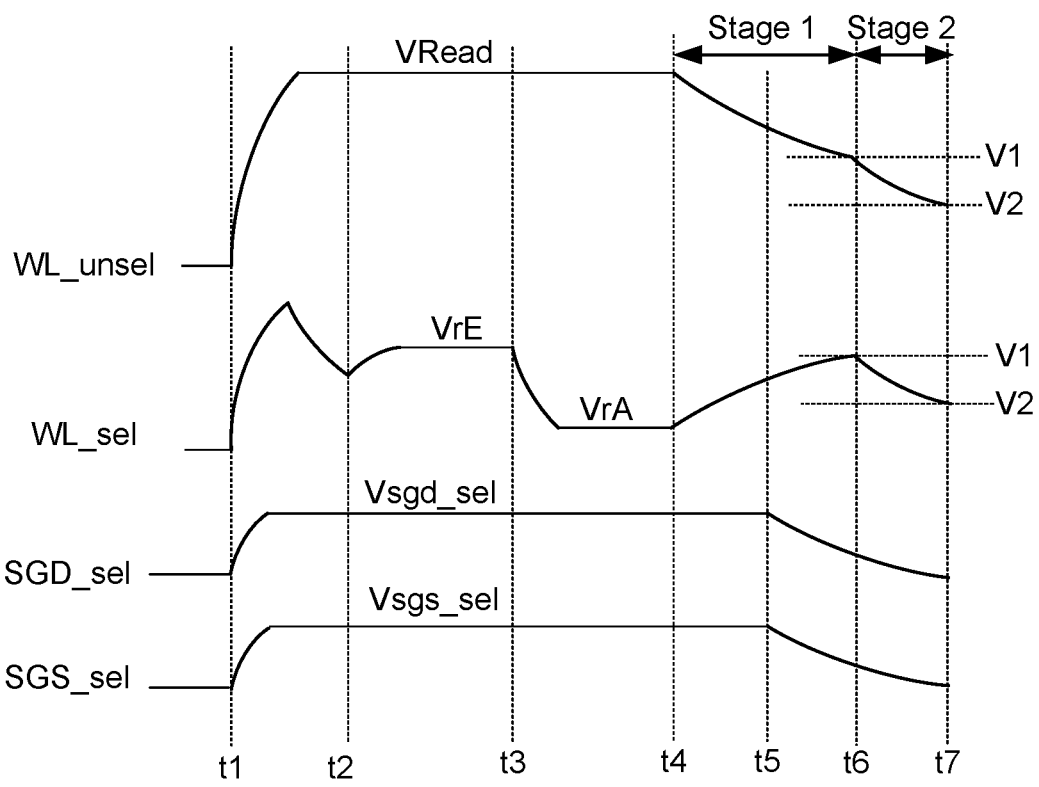
FIG. 10 is a diagram illustrating timing of voltages applied to word lines and select lines during an embodiment of reading a lower page with multi-stage discharge of the voltage on unselected word lines.
Figure 11:
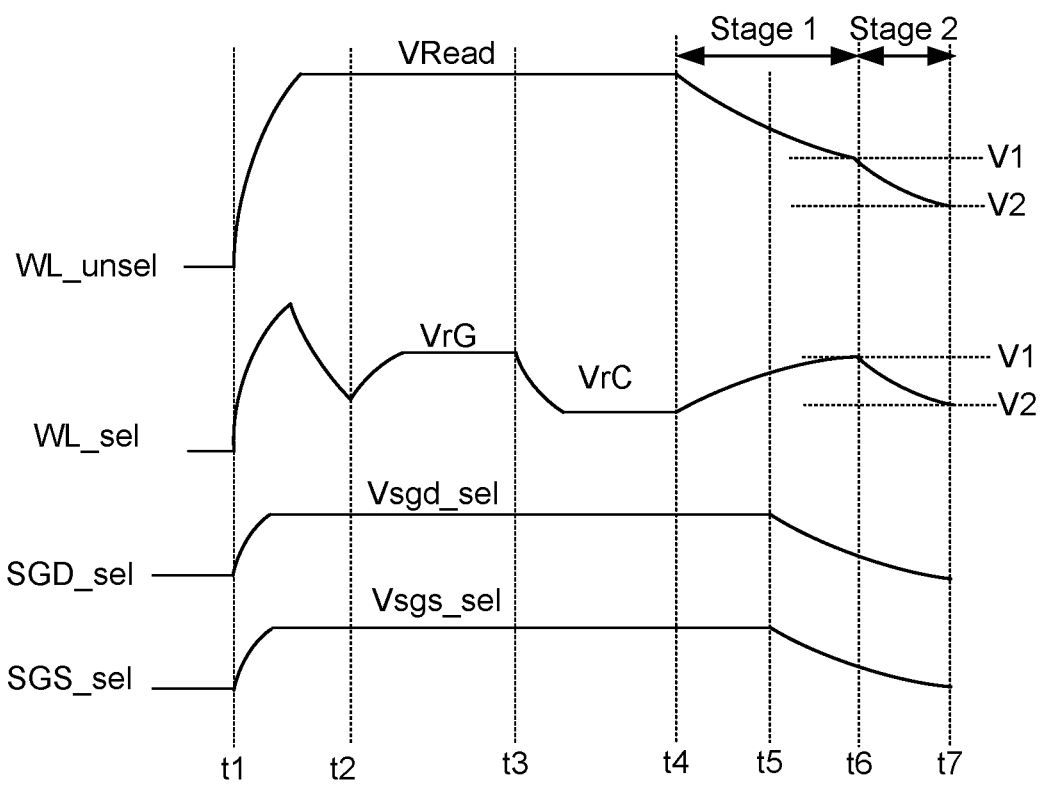
FIG. 11 is a diagram illustrating timing of voltages applied to word lines and select lines during an embodiment of reading an upper page with multi-stage discharge of the voltage on unselected word lines.
Figure 12:
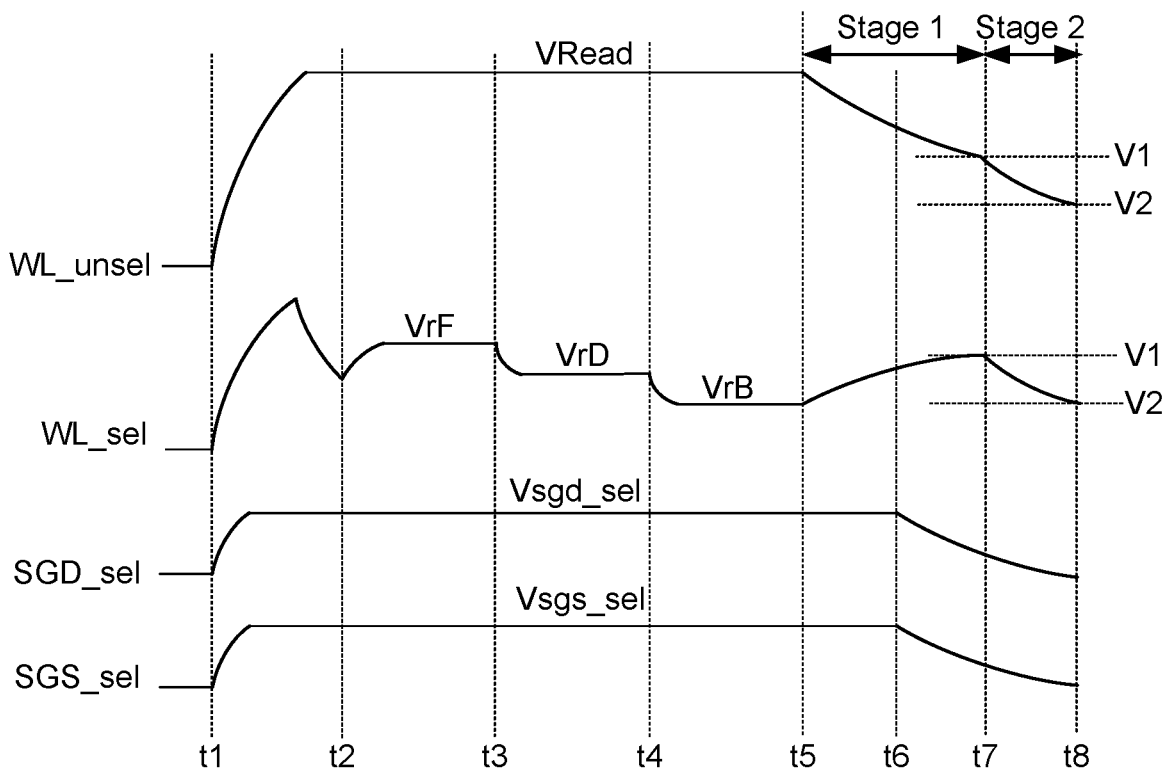
FIG. 12 is a diagram illustrating timing of voltages applied to word lines and select lines during an embodiment of reading a middle page with multi-stage discharge of the voltage on unselected word lines.

FIGS. 10, 11, and 12 depict timing diagrams of embodiments of a read having a two-stage discharge of Vread following reading a page. FIGS. 10, 11, 12 are for an MLC read when the group of memory cells stores three pages (lower, middle, upper). A three page example is consistent with the example Vt distributions and read reference voltages in FIG. 5B. FIGS. 10, 11, 12 correspond to reading a lower, upper, and middle page, respectively.

Referring now to FIG. 10, at t1 the voltages on the unselected word line and select lines are increased similar to already discussed with respect to the example in FIG. 6. However, FIG. 10 adds a "read spike" voltage on the selected word line between t1 to t2. The read spike voltage is not a requirement but may be used. The sensing sequence is to first apply VrE (and sense) and then lower WL_sel to VrA (and sense). Sensing at VrA and VrE is used to read the lower page of data. As depicted in FIG. 10, at 14, the voltage on WL_sel begins to increase from VrA towards V1. By the end of Stage 1, the voltage on WL_sel has reached V1. The voltages on WL_unsel, SGD_sel, and SGS_sel may be discharged in Stage 1 and Stage 2 similar to the discussion above with respect to FIG. 6.

In an alternative embodiment, the order in which VrA and VrE are applied to the selected word line are reversed. Thus, VrA may be applied prior to VrE. In the event that VrE has a higher magnitude than V1, the voltage on WL_sel may be reduced in Stage 1 from VrE to V1. However, if VrE has a lower magnitude than V1, the voltage on WL_sel may be increased in Stage 1 from VrE to V1.

Referring now to FIG. 11, the "read spike" voltage is depicted on the selected word line between t1 to t2. The read spike voltage is not a requirement but may be used. The sensing sequence is to first apply VrG (and sense) and then lower WL_sel to VrC (and sense). Sensing at VrG and VrC is used to read the upper page of data. As depicted in FIG. 11, at t4, the voltage on WL_sel begins to increase from VrC towards V1. By the end of Stage 1, the voltage on WL_sel has reached V1. The voltages on WL_unsel, SGD_sel, and SGS_sel may be discharged in Stage 1 and Stage 2 similar to the discussion above with respect to FIG. 6.

In an alternative embodiment, the order in which VrG and VrC are applied to the selected word line are reversed. Thus, VrC may be applied prior to VrG. In the event that VrG has a higher magnitude than V1, the voltage on WL_sel may be reduced in Stage 1 from VrG to V1. However, if VrG has a lower magnitude than V1, the voltage on WL_sel may be increased in Stage 1 from VrG to V1.

Referring now to FIG. 12, the "read spike" voltage is depicted on the selected word line between t1 to t2. The read spike voltage is not a requirement but may be used. The sensing sequence is to first apply VrF (and sense), then lower WL_sel to VrD (and sense), then lower WL_Sel to VrB (and sense). Sensing at VrF. VrD, and VrB is used to read the middle page of data. As depicted in FIG. 12, at t4, the voltage on WL_sel begins to increase from VrB towards V1. By the end of Stage 1, the voltage on WL_sel has reached V1. The voltages on WL_unsel, SGD_sel, and SGS_sel may be discharged in Stage 1 and Stage 2 similar to the discussion above with respect to FIG. 6.

In an alternative embodiment, the order in which VrF. VrD and VrB are applied to the selected word line are reversed. For example, the order may be: VrB, VrD, VrF. In the event that VrF has a higher magnitude than V1, the voltage on WL_sel may be reduced in Stage 1 from VrF to V1. However, if VrF has a lower magnitude than V1, the voltage on WL_sel may be increased in Stage 1 from VrF to V1.

There are many different possible ways that the pages of data may be mapped to the read reference levels. Therefore, it will be understood that other combinations of read reference levels could be used to read a page of data. Also, embodiments of two-stage discharge of Vread may be used when reading memory cells that store any number of pages.

In view of the foregoing, an embodiment includes an apparatus comprising one or more control circuits configured to connect to a memory structure having memory cells. The memory structure has word lines connected to the memory cells. The one or more control circuits are configured to apply a read reference voltage to a selected word line, wherein the selected word line is connected to selected memory cells. The one or more control circuits are configured to apply a read pass voltage to unselected word lines while applying the read reference voltage to the selected word line, wherein the unselected word lines are connected to unselected memory cells. The one or more control circuits are configured to sense the selected memory cells while the read pass voltage is applied to the unselected word lines and the read reference voltage is applied to the selected word line. The one or more control circuits are configured to reduce the read pass voltage on the unselected word lines to a first voltage while changing the read reference voltage on the selected word line to the first voltage. Reducing the read pass voltage and changing the read reference voltage is performed after sensing the selected memory cells. The one or more control circuits are configured to reduce the voltage on the unselected word lines and the selected word line together from the first voltage to a second voltage.

In a further embodiment, the memory structure comprises select lines configured to select the memory cells for sensing. The one or more control circuits are further configured to apply select voltages to the select lines while sensing the selected memory cells. The one or more control circuits are further configured to reduce the select voltages on the select lines after beginning to reduce the read pass voltage on the unselected word lines.

In a further embodiment, the one or more control circuits are further configured to begin to reduce the voltage on the unselected word lines from the first voltage to the second voltage after beginning to reduce the select voltages on the select lines.

In a further embodiment, the read reference voltage has a lower magnitude than the first voltage. The one or more control circuits are configured to increase the voltage on the selected word line from the read reference voltage to the first voltage while reducing the read pass voltage on the unselected word lines to the first voltage.

In a further embodiment, the read reference voltage has a higher magnitude than the first voltage. The one or more control circuits are configured to decrease the voltage on the selected word line from the read reference voltage to the first voltage while reducing the read pass voltage on the unselected word lines to the first voltage.

In a further embodiment, the read reference voltage is a final read reference voltage of a plurality of read reference voltages that the one or more control circuits apply to the selected word line while applying the read pass voltage to the unselected word lines to read a page of data from the selected memory cells.

In a further embodiment, the one or more control circuits are further configured to float the unselected word lines and the selected word line after reducing the voltage on the unselected word lines and the selected word line to the second voltage.

In a further embodiment, a magnitude of the first voltage is approximately one half a magnitude of the read pass voltage.

In a further embodiment, the apparatus is configured to receive a power supply voltage. The second voltage has a magnitude of the power supply voltage.

In a further embodiment, the memory cells in the memory structure comprise NAND strings.

In a further embodiment, the apparatus comprises a first semiconductor die comprising the memory structure. The apparatus comprises a second semiconductor die comprising the one or more control circuits. The second semiconductor die is bonded to the first semiconductor die.

An embodiment includes a method for reading memory cells in a three dimensional memory structure. The method comprises applying a read reference voltage to a selected word line connected to selected memory cells in a selected block. The selected block comprises word lines and NAND strings having memory cells. Each word lines in the selected block is connected to a memory cell of each NAND string in the block. The method comprises applying a read pass voltage to unselected word lines in the selected block while applying the read reference voltage to the selected word line. The unselected word lines are connected to unselected memory cells. The method comprises sensing the selected memory cells while the read pass voltage is applied to the unselected word lines and the read reference voltage is applied to the selected word line. The method comprises discharging a voltage on the unselected word lines from the read pass voltage to an intermediate voltage in a first stage after sensing the selected memory cells. The method comprises discharging a voltage on the unselected word lines from the intermediate voltage to a final voltage in a second stage.

An embodiment includes a non-volatile storage system, comprising a three-dimensional memory structure having a plurality of NAND strings having memory cells. The three-dimensional memory structure has word lines connected to the memory cells. The non-volatile storage system includes means for sensing selected memory cells in the three-dimensional memory structure, including means for applying a read pass voltage to unselected word lines in the three-dimensional memory structure. The non-volatile storage system includes means for discharging the read pass voltage on the unselected word lines in multiple stages after sensing the selected memory cells.

In an embodiment, the means for sensing selected memory cells in the three-dimensional memory structure includes one or more of: system control logic 260, state machine 262, power control 264, column control circuitry 210, R/W circuits 225, row control circuitry 220. In an embodiment, the means for sensing selected memory cells in the three-dimensional memory structure performs steps 902-910 of process 900. The means for sensing selected memory cells in the three-dimensional memory structure may include one or more of a processor, FPGA, ASIC, integrated circuit, or other type of circuit.

In an embodiment, the means for discharging the read pass voltage on the unselected word lines in multiple stages after sensing the selected memory cells includes one or more of: system control logic 260, state machine 262, two-stage discharge logic 263, power control 264, column control circuitry 210, R/W circuits 225, row control circuitry 220. In an embodiment, the means for discharging the read pass voltage on the unselected word lines in multiple stages after sensing the selected memory cells performs one or more of steps 912-916 of process 900. The means for discharging the read pass voltage on the unselected word lines in multiple stages after sensing the selected memory cells may include one or more of a processor, FPGA, ASIC, integrated circuit, or other type of circuit.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:
   one or more control circuits configured to connect to a memory structure having memory cells, the memory structure having word lines connected to the memory cells, wherein the one or more control circuits are configured to:
      apply a read reference voltage to a selected word line, wherein the selected word line is connected to selected memory cells;
      apply a read pass voltage to unselected word lines while applying the read reference voltage to the selected word line, wherein the unselected word lines are connected to unselected memory cells;

sense the selected memory cells while the read pass voltage is applied to the unselected word lines and the read reference voltage is applied to the selected word line;
      reduce the read pass voltage on the unselected word lines to a first positive voltage while changing the read reference voltage on the selected word line to the first positive voltage, wherein reducing the read pass voltage and changing the read reference voltage is performed after sensing the selected memory cells; and
      reduce the voltage on the unselected word lines and the selected word line together from the first positive voltage to a second positive voltage.

2. The apparatus of claim 1, wherein:
   the memory structure comprises select lines configured to select the memory cells for sensing; and
   the one or more control circuits are further configured to:
      apply select voltages to the select lines while sensing the selected memory cells; and
      reduce the select voltages on the select lines after beginning to reduce the read pass voltage on the unselected word lines.

3. The apparatus of claim 2, wherein the one or more control circuits are further configured to:
   begin to reduce the voltage on the unselected word lines from the first positive voltage to the second positive voltage after beginning to reduce the select voltages on the select lines.

4. The apparatus of claim 1, wherein:
   the read reference voltage has a lower magnitude than the first positive voltage; and
   the one or more control circuits are configured to increase the voltage on the selected word line from the read reference voltage to the first positive voltage while reducing the read pass voltage on the unselected word lines to the first positive voltage.

5. The apparatus of claim 1, wherein:
   the read reference voltage has a higher magnitude than the first positive voltage; and
   the one or more control circuits are configured to decrease the voltage on the selected word line from the read reference voltage to the first positive voltage while reducing the read pass voltage on the unselected word lines to the first positive voltage.

6. The apparatus of claim 1, wherein the read reference voltage is a final read reference voltage of a plurality of read reference voltages that the one or more control circuits apply to the selected word line while applying the read pass voltage to the unselected word lines to read a page of data from the selected memory cells.

7. The apparatus of claim 1, wherein the one or more control circuits are further configured to:
   float the unselected word lines and the selected word line after reducing the voltage on the unselected word lines and the selected word line to the second positive voltage.

8. The apparatus of claim 1, wherein a magnitude of the first positive voltage is approximately one half a magnitude of the read pass voltage.

9. The apparatus of claim 1, wherein:
   the apparatus is configured to receive a power supply voltage having a positive magnitude; and
   the second positive voltage has the positive magnitude of the power supply voltage.

10. The apparatus of claim 1, wherein the memory cells in the memory structure comprise NAND strings.

11. The apparatus of claim 1, wherein the apparatus comprises:

a first semiconductor die comprising the memory structure; and a second semiconductor die comprising the one or more control circuits, wherein the second semiconductor die is bonded to the first semiconductor die.

12. A method for reading memory cells in a three dimensional memory structure, the method comprising:

applying a read reference voltage to a selected word line connected to selected memory cells in a selected block, wherein the selected block comprises word lines and NAND strings having memory cells, each word lines in the selected block connected to a memory cell of each NAND string in the block;

applying a read pass voltage to unselected word lines in the selected block while applying the read reference voltage to the selected word line, wherein the unselected word lines are connected to unselected memory cells;

sensing the selected memory cells while the read pass voltage is applied to the unselected word lines and the read reference voltage is applied to the selected word line;

discharging a voltage on the unselected word lines from the read pass voltage to an intermediate positive voltage in a first stage after sensing the selected memory cells; and discharging a voltage on the unselected word lines from the intermediate positive voltage to a final positive voltage in a second stage.

13. The method of claim 12, further comprising:

increasing a voltage on the selected word line from the read reference voltage to the intermediate positive voltage during the first stage while discharging the read pass voltage from the unselected word lines to the intermediate positive voltage.

14. The method of claim 13, further comprising:

discharging the voltage on the selected word line from the intermediate positive voltage to the final positive voltage while discharging the voltage on the unselected word line from the intermediate positive voltage to the final positive voltage in the second stage.

15. The method of claim 13, further comprising:

applying select voltages to select lines in the block in the three dimensional memory structure, the select voltage are applied at least while sensing the selected memory cells; and initiating a discharge of the select voltages from the select lines after beginning to discharge the read pass voltage from the unselected word lines towards the intermediate positive voltage.

16. A non-volatile storage system, comprising:

a three-dimensional memory structure having a plurality of NAND strings having memory cells, the three-dimensional memory structure having word lines connected to the memory cells;

means for sensing selected memory cells connected to a selected word line in the three-dimensional memory structure, including means for applying a read pass voltage to unselected word lines in the three-dimensional memory structure and means for applying a read reference voltage to the selected word line;

means for discharging the read pass voltage on the unselected word lines in multiple stages after sensing the selected memory cells, including:

discharging a voltage on the unselected word lines from the read pass voltage to a positive intermediate voltage while increasing a voltage on the selected word line from the read reference voltage to the positive intermediate voltage in a first stage of the multiple stages; and discharging a voltage on the unselected word lines and the selected word line together from the positive intermediate voltage to a final positive voltage in a second stage of the multiple stages.

17. The non-volatile storage system of claim 16, wherein:

the three-dimensional memory structure includes select lines configured to select the NAND strings; and the means for discharging the read pass voltage on the unselected word lines in multiple stages after sensing the selected memory cells is configured to begin to discharge select voltages from the select lines during the first stage after beginning to discharge the read pass voltage on the unselected word lines but prior to the second stage.

18. The apparatus of claim 1, wherein the one or more control circuits are configured to:

generate an internal supply voltage; and use the internal supply voltage as the second positive voltage.

19. The apparatus of claim 18, wherein the one or more control circuits are configured to:

provide the internal supply voltage as a positive rail voltage to circuits on a memory die in the apparatus.

* * * * *